US012783750B2

(12) United States Patent
Yerubandi et al.

(10) Patent No.: US 12,783,750 B2
(45) Date of Patent: Nov. 3, 2026

(54) METHOD FOR REALTIME CEMENT JOB VALIDATION

(71) Applicant: Halliburton Energy Services, Inc., Houston, TX (US)

(72) Inventors: Krishna Babu Yerubandi, Houston, TX (US); Walmy Cuello Jimenez, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 1068 days.

(21) Appl. No.: 17/879,389

(22) Filed: Aug. 2, 2022

(65) Prior Publication Data

US 2024/0044228 A1 Feb. 8, 2024

(51) Int. Cl.
*G06F 30/20* (2020.01)

(52) U.S. Cl.
CPC .......... *G06F 30/20* (2020.01); *E21B 2200/20* (2020.05)

(58) Field of Classification Search
CPC .......... G06F 30/20; G06F 30/23; G06F 30/27; G06F 30/28; E21B 2200/20
See application file for complete search history.

(56) References Cited

U.S. PATENT DOCUMENTS

2012/0266175 A1* 10/2012 Zheng .................. G06F 9/5088 718/103
2014/0039797 A1* 2/2014 Gonzales ................ E21B 47/00 702/11
2014/0299377 A1 10/2014 Abbassian et al.
2017/0314353 A1* 11/2017 Viassolo ................. E21B 23/14
2018/0045031 A1* 2/2018 Shaposhnikov ........ E21B 33/14
2018/0363414 A1* 12/2018 Bogaerts ................. E21B 33/14
2020/0277848 A1* 9/2020 Johnston ................. E21B 44/00
(Continued)

FOREIGN PATENT DOCUMENTS

WO 2016085483 A1 2/2016
WO 2019005908 A1 3/2019

OTHER PUBLICATIONS

Al-Yami, Abdullah S., et al. "Executing and monitoring cement job real time." SPE Oil and Gas India Conference and Exhibition. SPE, 2019. (Year: 2019).*
(Continued)

*Primary Examiner* — David A Hopkins
(74) *Attorney, Agent, or Firm* — Conley Rose, P.C.; Rodney B. Carroll

(57) ABSTRACT

A method for controlling, tailoring, monitoring and executing a pumping operation of a wellbore treatment into a wellbore with an advisory process accessing pumping simulation results from a pumping model group. The advisory process can determine a change in the wellbore environment by comparing periodic datasets indicative of a pumping operation to a set of operational threshold values. The advisory process can identify the change in the wellbore environment from pumping simulation results generated by a pumping model group with pumping model inputs comprising portions of the periodic datasets. The advisory process can generate a modified pumping procedure in response to the identification of the change in the wellbore environment. The pumping model group can generate and forecast a probability of the pumping operation achieving a job objective.

20 Claims, 8 Drawing Sheets

(56) References Cited

U.S. PATENT DOCUMENTS

| | | | | |
|---|---|---|---|---|
| 2021/0238980 | A1 | 8/2021 | Vargo, Jr. | |
| 2021/0406426 | A1* | 12/2021 | Han | G06F 30/10 |
| 2022/0003229 | A1* | 1/2022 | Mu | F04B 47/02 |
| 2022/0018212 | A1* | 1/2022 | Al-Somali | E21B 47/01 |
| 2022/0205340 | A1* | 6/2022 | Liu | G06F 30/10 |
| 2022/0243568 | A1* | 8/2022 | AlTammar | E21B 43/26 |
| 2023/0055082 | A1* | 2/2023 | Jandhyala | E21B 33/14 |

OTHER PUBLICATIONS

API. "Isolating Potential Flow Zones During Well Construction, Std. 65-2." (2010) (Year: 2010).*

Balanza, Jose Antonio, Luis Carlos Justiniano, and Isabel Poletzky. "Implementation of managed pressure casing drilling and managed pressure cementing techniques in unconventional reservoirs." SPE/IADC Drilling Conference and Exhibition. SPE, 2015. (Year: 2015).*

Bjørkevoll, Knut Steinar, Dag Ove Molde, and Helge Fjeldberg. "Utilize Manage Pressure Drilling equipment and technique to cement a severely depleted HPHT reservoir in the North Sea." SPE Russian Petroleum Technology Conference. SPE, 2008. (Year: 2008).*

De La Cruz Sasso, Alejandro, et al. "Key factors in managed pressure cementing for deep water." SPE Kingdom of Saudi Arabia Annual Technical Symposium and Exhibition. SPE, 2018. (Year: 2018).*

De la Cruz Sasso, Alejandro, Thiago Pinheiro da Silva, and Patrick Brand. "MPC Successful Application in Deepwater Exploration: Case Study." Offshore Technology Conference Brasil. OTC, 2017. (Year: 2017).*

Dennis, Moore, and Don Hannegan. "Offshore Well Construction With Closed-Loop Cementing Technology." SPE/IADC Managed Pressure Drilling and Underbalanced Operations Conference and Exhibition. SPE, 2013. (Year: 2013).*

Ficetti, S., et al. "Innovative techniques for unconventional reservoirs: Managed pressure cementing application in Western Argentina Shale Formations." SPE/IADC Managed Pressure Drilling and Underbalanced Operations Conference and Exhibition. SPE, 2016. (Year: 2016).*

Gradishar, R., et al. "Utilizing Managed Pressure Drilling to overcome narrow margins during liner running and cementing operations." SPE Annual Technical Conference and Exhibition. SPE, 2017. (Year: 2017).*

Jose, Sunil Jacob, and Daniel J. Daulton. "Real-Time Process Assurance of Offshore Cementing Operations." SPE Digital Energy Conference and Exhibition. SPE, 2015. (Year: 2015).*

Kazakbayeva, Zhanna, et al. "Successful implementation of managed pressure drilling and managed pressure cementing techniques in fractured carbonate formation prone to total lost circulation in Far North Region." SPE Eastern Europe Subsurface Conference. SPE, 2021. (Year: 2021).*

Rostami, S. Ameen, et al. "Managed Pressure Cementing in HPHT utilizing real time pressure estimation and control software—A case Study." Offshore Technology conference. OTC, 2017. (Year: 2017).*

Russell, Evan, Aaron Katz, and Bradley Pruett. "Achieving zonal isolation using automated managed pressure cementing." SPE/IADC Managed Pressure Drilling and Underbalanced Operations Conference and Exhibition. SPE, 2016. (Year: 2016).*

Singh, Harpreet Kaur Dalgit, et al. "MPD Closed Loop Cementing in High-Pressure, High-Temperature Wells in Vietnam." International Petroleum Technology Conference. IPTC, 2016. (Year: 2016).*

Smith, Jeffrey, et al. "Reclaiming the Operating Window: A Managed Pressure Cementing Workflow to Achieve Zonal Isolation Success in a Mature Field." SPE/IADC Managed Pressure Drilling and Underbalanced Operations Conference and Exhibition. SPE, 2021. (Year: 2021).*

Teoh, Michael, et al. "Managed pressure cementing MPC within a narrow pressure window, deepwater Gulf of Mexico application." SPE/IADC Managed Pressure Drilling and Underbalanced Operations Conference and Exhibition. SPE, 2019. (Year: 2019).*

Zhou, Haobo, et al. "A novel approach of dynamic parameter calculation in real time while managed pressure cementing and its application in ultra-deep well." IADC/SPE Asia Pacific Drilling Technology Conference and Exhibition. SPE, 2021. (Year: 2021).*

Brownlee, Jason. How to Combine Predictions for Ensemble Learning. Article on Machine Learning Mastery. Apr. 27, 2021. URL: machinelearningmastery(dot)com/combine-predictions-for-ensemble-learning/ (Year: 2021).*

Foreign Communication from Related Application—International Search Report and Written Opinion of the International Searching Authority, International Application No. PCT/US2022/041476, dated Apr. 26, 2023, 9 pages.

* cited by examiner

METHOD FOR REALTIME CEMENT JOB VALIDATION

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

In oil and gas wells, a primary purpose of a barrier composition such as cement or a sealant is to isolate the formation fluids between zones, also referred to as zonal isolation and zonal isolation barriers. Cement is also used to support the metal casing lining the well, and the cement provides a barrier to prevent the fluids from damaging the casing and to prevent fluid migration along the casing.

Typically an oil well is drilled to a target depth with a drill bit and mud fluid system. A metal pipe (e.g., casing, liner, etc.) is lowered into the drilled well to prevent collapse of the drilled formation. Cement is placed between the casing and formation with a primary cementing operation comprising pumping a cement blend tailored for the environmental conditions of the wellbore.

The cementing operation may utilize specialized pumping equipment on the drilling rig or transported to the drilling rig. The cement is typically pumped down the casing and back up into the annular space between the casing and formation. The cementing operation may encounter deviations within the wellbore path or changing downhole environmental conditions that require modifications to the cement blend, the pumping procedure, or additional wellbore treatments. A method of validating modifications made to a cementing operation is desirable.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
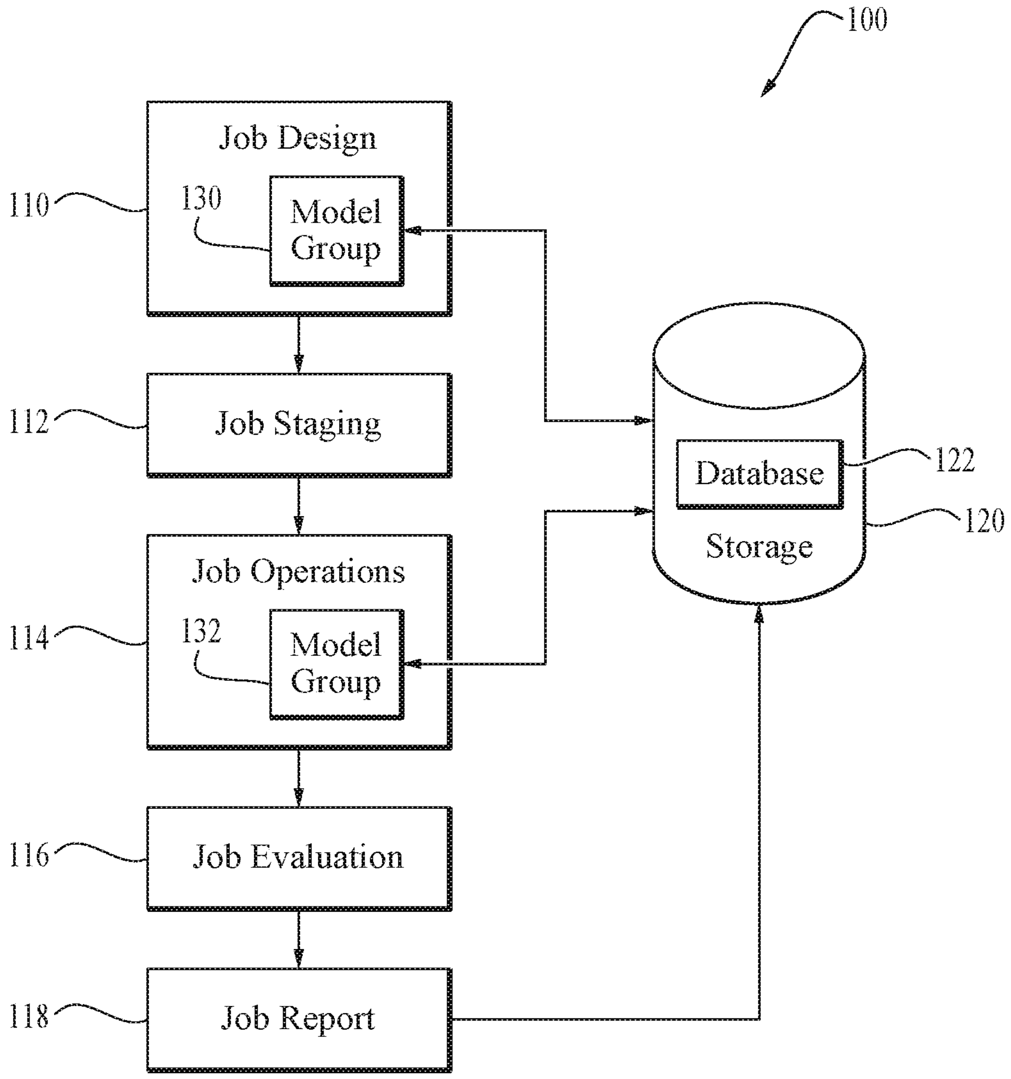
FIG. 1 is a logical flow diagram depicting a methodology for a wellbore servicing operation according to an embodiment of a well system.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

An oil well can be drilled with a drill bit and mud system. A suitable drilling rig can be located on a drilling pad or offshore above the drilling location. As the drill bit penetrates the earth strata, a drilling mud is pumped down a drill string to bring cuttings back to surface. The drilling mud can be water based or oil based with a clay material to increase the weight of the fluid. The drilling mud may also contain various other chemicals to for compatibility with the wellbore and to enhance the ability to return cuttings to surface. The weight of the drilling fluids can retain the desired hydrocarbons in the formation until the well is completed. A string of casing, generally defined as individual lengths of pipe threaded together, can be lowered into the drilled wellbore to prevent the wellbore from caving in or collapsing.

During well completion, it is common to introduce a cement slurry, e.g., cement composition, into the annulus formed between the casing and the wellbore. The cement typically used for cementing oil wells can be a Portland cement comprised of a hydraulic cement with a source of free lime and alkali ions, a source of calcium carbonate, a source of calcium sulfate and an organic component. The composition of the cement can be tailored for compatibility with the properties of a subterranean formation or a production zone. The cement slurry may also include various additives to modify the hydraulic cement for a given pumping operation. The additives may modify the viscosity of the cement slurry for the pumping operation. One or more additives may control the set time, e.g., accelerate or retard. For example, the cement slurry for an extended wellbore with a high bottom hole temperature may have chemicals added to decrease the pumping pressure, e.g., viscosity modifier, and to retard the set time for the temperature.

A primary cementing operation can include various downhole equipment that can enhance the quality of the cement bond. A float shoe can be coupled to the end of the casing string, also referred to as casing. The float shoe can include one or more flow control devices such as check valves. A stage tool, e.g., a casing valve operated by various positioning tools, can be included on the casing string to decrease the pumping pressure values for extended reach wells, e.g., long casing strings. A plurality of casing centralizers can maintain the annular gap between the casing and the wellbore. The cement slurry can be separated from the drilling fluids and various other fluids used in the pumping operations by a combination of downhole tools and specialized fluids, e.g., spacer fluid, by pump down cementing plugs, wiper darts, wiper balls, foam balls, and various other pump down articles. The type of downhole equipment selected can depend on the well type, formation properties, drilling mud properties, wellbore environment, e.g., pressure and temperature, or a combination of factors.

An alternate method of primary cementing can include reverse circulation cementing where the cement slurry is pumped down the annular space between the casing string and the wellbore instead of through the inside of the casing string. In some scenarios, the wellbore may be drilling through a weak formation that can't withstand the applied pressures from primary cementing. A weak formation may fracture from the applied pressures causing a loss of cement to the formation. Reverse circulation cementing comprises placing cement at lower pump pressures into the annular space and thus avoiding the loss of cement to a weak formation.

Another alternate method of cementing a wellbore can include cross-over cementing that is typically used with a liner string. In some scenarios, a primary casing string can be cemented into place and a smaller diameter wellbore may be drilled from the primary casing string. A liner string (smaller size of casing) can be lowered into the smaller diameter wellbore and cemented into place with a cross-over cementing method comprising a workstring and a cross-over tool. The cement is pumped down the workstring and placed into the annular space between the liner string and the smaller wellbore by the cross-over tool. A return flow of drilling mud can be taken up the inside of the liner string then directed to the annular space between the outside of the workstring and the inside of the primary casing string. In some scenarios, a liner hanger can be utilized to anchor and seal the liner string. The cross-over cementing method can place cement slurry about a liner string at a lower pressure than conventional liner cementing methods.

The cement pumping operation can include one or more pumping units comprising a mixing system, a main pump assembly, a chemical additive system, and various mixing pumps and mixing valves. The mixing system on the pumping units can include one or two mixing drums with one or more mixing pumps. The pumping units can include sensors located throughout the mixing system to measure fluid properties of the cement blend, such as pressure and density. The cement pumping system can be trailer mounted or skid mounted.

The cement sheath placed in the annulus between the casing and the wellbore can be evaluated with an acoustic logging tool conveyed into the casing by wireline after the primary cementing pumping operation has been completed and the cement has hardened. An acoustic logging can evaluate the cement sheath for quality and consistency.

A primary cementing job may provide an isolation barrier to isolate the formation to prevent formation fluids from migrating and damaging the casing. An analysis of the wellbore from drilling data may determine a wellbore stress level also referred to as a wellbore stress state. The cement blend and pumping procedure can be designed to withstand the wellbore stress state. A cement blend and pumping procedure may be designed based on the planned drilling trajectory and anticipated wellbore environment. However, in some cases, the wellbore path may deviate from the planned drilling trajectory. In another scenario, the wellbore environment can include unanticipated formation features, such as wellbore washout or low pressure formation. The changes to the wellbore environment and/or planned drilling trajectory may lower a probability of a successful cement placement. In a first scenario, the pumping procedure may need to be redesigned for an additional volume of the cement blend. In a second scenario, an additional wellbore treatment may need to be placed into the well via a spacer fluid. Although two scenarios are given, it is understood that a cementing operation may encounter many more unanticipated formation features and that these scenarios are provided as examples. The cementing operation may need to be redesigned or modified due to the change to the planned drilling trajectory or wellbore environment. This redesign or modification to the cementing operation may increase the probability of a successful cement placement. A method of designing a cement blend and pumping procedure based on changes to the wellbore environment is desirable.

One solution to the unplanned changes in a cementing operation is to utilize a group of models to provide a probability of successful cement placement. An advisory process executing on a computer system on the pumping unit can access a group of models to modify the pumping operation and to provide a probability of a successful cement placement. In an embodiment, the advisory process can load the cement design comprising a cement blend and a pumping procedure. The advisory process can access the model results from the model group utilized to design the cement design. The advisory process direct the pumping operation per the pumping procedure and retrieve a periodic dataset indicative of the pumping operation. The periodic datasets can be from sensors coupled to the pumping unit, sensors fluidically coupled to the wellbore, sensors located within the wellbore, or combinations thereof. The advisory process can determine a deviation from the cement design by comparing the periodic datasets to the model results. The advisory process can modify the model results by inputting a modified model input from the periodic datasets. The advisory process can modify the pumping operation with the updated model results received from the model group. The model group can provide a probability of a successful cement placement based on the updated model results. The advisory process can determine a modified cement design comprising a cement blend and a pumping procedure in response to changes to the wellbore environment.

Disclosed herein is a method of modifying a cement design based on changes to the wellbore environment. An advisory process can determine a modified cement design comprising a cement blend, a chemical treatment, a pumping procedure, or combinations thereof based on updated model results received from a model group in response to real-time periodic datasets.

A cementing job may have one or more objectives for the wellbore servicing operation to complete. For example, the wellbore servicing operation can include pumping cement into an annulus to form at isolation barrier from the end of the casing to a target height referred to as Top of Cement (TOC). The TOC can be the job objective or one of a set of job objectives. The overall job design of the cementing job may include a series of steps, e.g., the pumping procedure, for completing the set of job objectives. An engineer may generate a job design with the goal of completing the one or more job objectives with a design process. Turning now to FIG. 1, a logical flow diagram depicting a methodology for a wellbore servicing operation 100 is illustrated. In an embodiment, the wellbore servicing operation 100 comprises the steps of job design 110, job staging 112, job operations 114, job evaluation 116, and job report 118. The engineer may generate the job design 110 from a design process executing on a computer system based on customer inputs, wellbore environment, at least one job objective, a design model group 130, an inventory of materials, or combinations thereof. The design inputs, e.g., wellbore environment, can be retrieved from a database 122 located on a storage computer 120 or similar storage device. The wellbore servicing operation may be simulated by the design model group 130 executing on a computer system comprising at least two models to determine an operational characteristic, for example, a set of hydraulic pumping pressures of the wellbore treatment fluid, e.g., cement slurry, based on the wellbore trajectory. One or more models within the design model group 130 can retrieve the design inputs from the database 122 to provide a set of design simulation results. The design simulation results by the design model group 130 can be stored on the storage computer 120 and/or within the database 122. The job design comprising the pumping procedure, the bill of materials, an inventory of assigned pumping units, an inventory of downhole tools, various chemicals, or combinations thereof, may be stored in the storage computer 120 and submitted to the customer and/or service center for approval. In some embodiments, the design process can be executing on a first computer and the design model group 130 can be executing on a second computer. In some embodiments, the first computer and the second computer can be the same computer. In some embodiments, the first computer and the second computer can be different computers. In some embodiments, the database 122 is located i) on the first computer, ii) on the second computer, iii) on a storage computer, or iv) on a similar storage device.

The wellbore servicing operation 100 can assign the various equipment for the wellbore servicing operation during job staging 112. The wellbore servicing operation 100 can assign or select pumping units and various other equipment from an inventory of available equipment. The pumping units include a computer system, such as a unit controller, for monitoring and control of the pumping operation. A bill or materials for the cement blend, various chemicals, wellbore treatments, and an inventory of downhole tools can be loaded onto a transport vehicle, skid, or basket for transport to the wellsite.

The equipment and materials assigned in the job staging 112 step may be transported to the wellsite for the job operation 114. The service personnel may stage the equipment and materials about the wellsite. In some embodiments, the service personnel can fluidically connect the pumping equipment to the wellbore. In some embodiments, the service personnel can communicatively connect, e.g., network, the pumping equipment. In some embodiments, the service personnel may retrieve the job design including the pumping procedure before leaving the service center, before arriving at the wellsite, at the wellsite, or combination thereof. The pumping procedure may be loaded into the computer system communicatively connected to the pumping equipment, for example, on the unit controller.

The service personnel may perform the job operations 114, e.g., pumping operation, to blend the wellbore treatment per the pumping procedure of the job design 110. During the job operations 114, the service personnel may modify the job design 110, e.g., the pumping procedure, based on an unexpected occurrence within the wellbore trajectory or the wellbore environment. For example, the service personnel may encounter an unknown low pressure zone within the wellbore that results in fluid loss to the formation. An advisory process executing on the unit controller of the pumping unit can detect the change in the wellbore environment by comparing a periodic dataset to the design simulation results from the design model group 130. The advisory process can simulate the current wellbore environment with a set of model variables taken from the periodic dataset. The advisory process can generate a set of pumping simulation results from a pumping model group 132. The pumping model group 132 may be the same as or different from the design model group 130. The pumping simulation results can include a probability value for achieving the job objective. The advisory process can modify the wellbore treatment, the pumping procedure, or both with the pumping simulation results. The advisory process can continually update the pumping simulation results and the probability value as the pumping operation progresses. In some embodiments, the pumping model group 132 can retrieve drilling data, wellbore data, chemical data, material data, or combinations thereof from the database 122 on the storage computer 120. In some embodiments, the advisory process can be executing on a first computer, e.g., unit controller, and the pumping model group 132 can be executing on a second computer at the wellsite. In some embodiments, the first computer and the second computer can be the same computer, e.g., the unit controller. In some embodiments, the first computer and the second computer can be different computers. In some embodiments, the database 122 is located i) on the first computer, ii) on the second computer, iii) on a storage computer, or iv) on a similar storage device. In some embodiments, the advisory process can be executing on a computer system at the wellsite. In some embodiments, the model group 132 can be executing on a computer at the wellsite or on a remote computer system as will be disclosed further herein. The advisory process can alert the service personnel of a probability value for achieving the at least one job objective within the pumping simulation results.

The wellbore servicing operation 100 may include a job evaluation 116 after the conclusion of the job operations 114. The job evaluation 116 can include one or more tests to determine the current state of the wellbore barrier, e.g., the cement barrier. For example, a wireline tool may be lowered into the wellbore to perform a cement bond log. The analysis of the data from the wireline tool can determine the top of cement location, the volume of cement behind the casing, the bond strength of the cement, or combinations thereof. In another scenario, the job evaluation 116 can include a cement test leak off test to determine the strength of the wellbore barrier. The dataset and analysis obtained by the one or more tools utilized in the job evaluation 116 can be stored in the storage computer 120.

A job report 118 may be generated at the conclusion of the wellbore servicing operation 100. The job report 118 may comprise the job design, the design simulation results, a report of the pumping operation, the pumping simulation results, a log of wellbore environmental changes identified, a log of modifications to the pumping procedure, or combinations thereof. The job report 118 can be used to improve the design model group 130 and the pumping model group 132.

Figure 2:
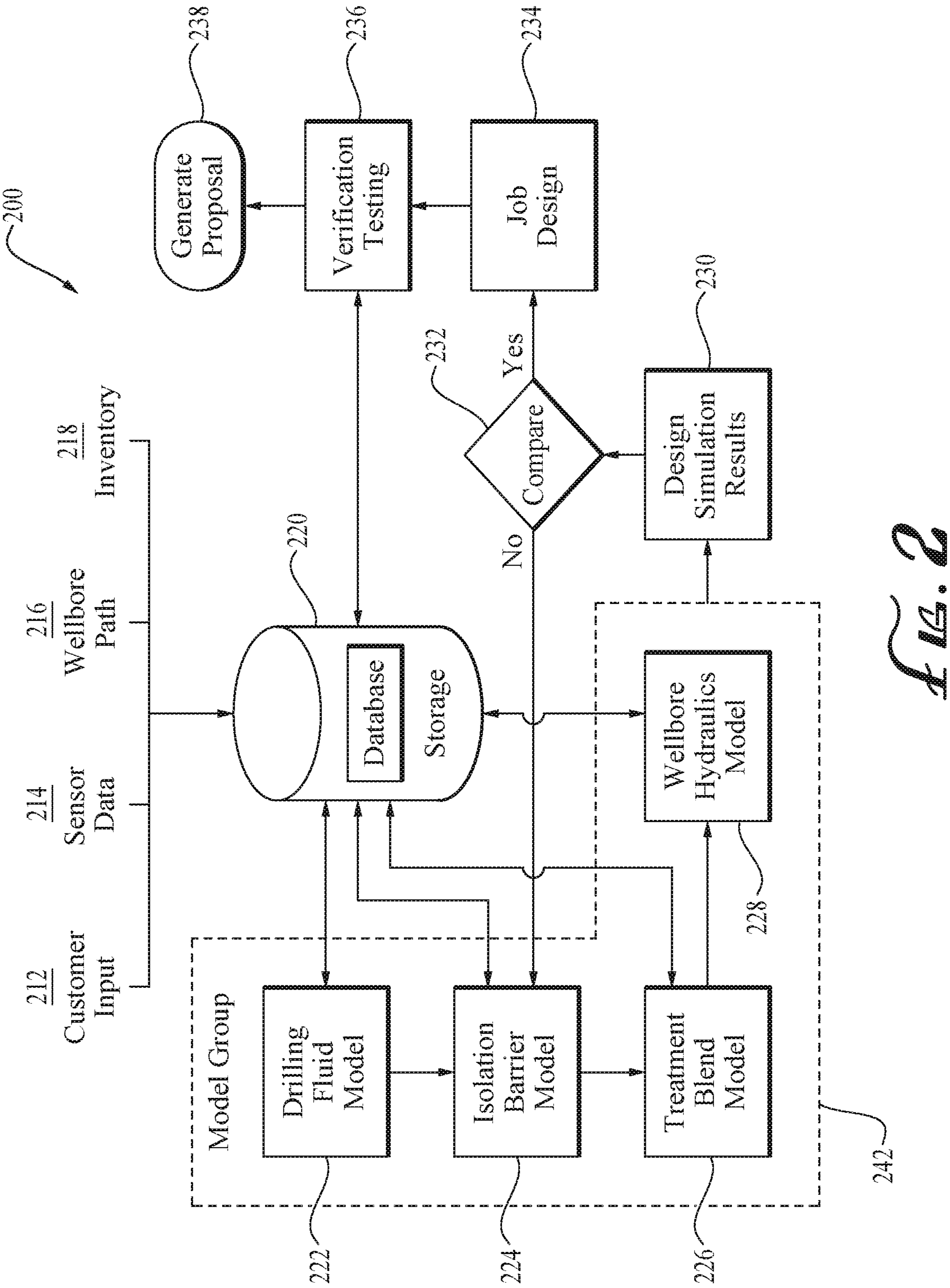
FIG. 2 is a logical flow diagram depicting a design process to generate a job design according to an embodiment of the disclosure.

The design model group 130 utilized during the job design 110 can include at least one model to simulate the fluid properties, e.g., pressure and flow rate, of the wellbore treatment during the pumping operation. Turning now to FIG. 2, a wellbore treatment design process 200 is illustrated with a logical flow diagram. The wellbore treatment design process 200 can be an embodiment of the design process and the model group 242 can be an embodiment of the model group 130 from FIG. 1. In some embodiments, a model group 242 comprises at least one of a drilling fluid model 222, an isolation barrier model 224, a treatment blend model 226, and a wellbore hydraulics model 228. Although four models are illustrated, it is understood that two or more models, for example the isolation barrier model 224 and the treatment blend model 226, can be combined into a single model. Each model of the model group 242 can be communicatively connected to a database on a storage device 220.

The design process 200 can begin with the drilling fluid model 222 of the model group 242. The drilling fluid model 222 may retrieve a wellbore dataset comprising customer input 212, sensor data 214, a wellbore path 216, and a materials inventory 218 from the database. The customer input 212 can include at least one job objective. The sensor data 214 can include mud pulse datasets, mud system datasets, a mud report, periodic datasets of circulation pressure, density, and mud rheology. The wellbore path 216 can comprise the well trajectory (e.g., inclination), formation properties, and a description of the wellbore environment by depth measurements, e.g., pressure and temperature at a measured depth.

The materials inventory 218 can include wellbore tubulars, an inventory of cement ingredients, an inventory of chemicals, an inventory of downhole tools, or combinations thereof. Although the model is described as retrieving the wellbore data from the database, it is understood that a portion of the wellbore data may be inputted by other methods, for example, by an engineer. The drilling fluid model 222 can determine the equivalent circulating density (ECD) of the drilling fluids, also referred to as the dynamic density, that determines a pressure loss in response to fluid friction along the wellbore and tubulars along with the static density of the drilling fluids. The inputs into the drilling fluid model 222 can be temperature and pressure dependent. The output of the drilling fluid model 222 can include, the ECD, a hole cleaning efficiency, and the wellbore stability based on fluid loss and/or the circulation rate. The output of the drilling fluid model 222 can include a set of design simulation results with a probability value of achieving the design simulation results. For example, the design simulation results can include a probability of circulating fluid without fracturing the formation based on ECD, pumping pressure, flowrate, and fluid rheology. The design process 200 can utilize the output of the drilling fluid model 222, e.g., the ECD, as one of the threshold values for the pumping procedure and/or a wellbore hydraulics model 228 as will be described herein.

The output of the drilling fluid model 222 can be an input into another model within the model group 242, for example, the isolation barrier model 224. In some embodiments, the isolation barrier model 224 can retrieve the wellbore dataset including the materials inventory 218 and the wellbore path 216 to simulate the stress state of the cured cement. The term wellbore isolation barrier may refer to Portland cement, a blend of Portland cement, a polymer, or combinations thereof that has cured or hardened. In some embodiments, the isolation barrier analysis process can be an isolation barrier analysis model. The isolation barrier analysis process can determine a stress state of the wellbore isolation barrier from the inputs. The isolation barrier model 224 can determine an isolation barrier, e.g., cured cement, with mechanical properties greater than the wellbore stress level from wellbore inputs comprising a wellbore tubular, a wellbore path 216, an inventory of downhole equipment, or combinations thereof. In some embodiments, the isolation barrier analysis process may generate a first barrier design based on simulation of the inputs provided. The output of the isolation barrier model 224 can include can include a set of design simulation results with a probability value of achieving the design simulation results. For example, the isolation barrier model 224 may generate a probability of a first barrier design exceeding a future stress state based on design simulation results of a cement blend within the wellbore path 216.

The output of the isolation barrier model 224 may be an input into another model within the model group 242, for example, the treatment blend model 226. The treatment blend model 226 may be based on a treatment database comprising experimental data, field data, historical data, or combinations thereof. The experimental data can include laboratory testing of the wellbore treatment in wellbore environmental conditions. The field data can comprise field reports and job observations of the application of the wellbore treatment. The historical data can include job reports comprising the wellbore treatment, the wellbore conditions, and an evaluation of the results. The treatment blend model 226 may determine a first cement blend based on the first barrier design received from the isolation barrier model 224. The design process 200 may input a set of isolation barrier mechanical property requirements, e.g., customer input 212, for a given set of wellbore environmental conditions, e.g., temperature, pressure, and/or density into the treatment blend model 226. The treatment blend model 226 may determine a cement blend by comparing the wellbore conditions to the treatment database. The treatment blend model 226 may extrapolate a cement blend based upon a comparison of wellbore environment conditions to the treatment database. The extrapolation may be a simple linear or in some cases, a non-linear extrapolation. In some embodiments, the treatment blend model 226 may determine a wellbore treatment comprising a spacer fluid, such as a fluid loss treatment. The treatment blend model 226 can determine a chemical blend for a spacer fluid in response to a predicted fluid loss event. The treatment blend model 226 may tailor the wellbore treatment for compatibility with the formation, the drilling fluids, the wellbore temperature, the wellbore pressure, or combinations thereof based on the treatment database. The treatment blend model 226 may extrapolate a treatment blend based upon a comparison of wellbore environment conditions to the treatment database. The treatment blend model 226 can determine a probability of achieving a job objective based on the simulation results. In some embodiments, the treatment blend model 226 can determine a deviation from a predicted material property based on real-time data received from the pumping operation. For example, one or more models may determine a change in the wellbore environment. In another scenario, one or more models may determine a change in the wellbore treatment, e.g., a lower density, during the mixing process. A deviation in the wellbore environment or the treatment blend can result in a change to the predicted outcome. For example the cement blend may have more or less compressive strength than originally predicted. In another scenario, the treatment blend may have a different viscosity, thickening time, or density. The treatment model 226 can determine a probability of achieving a job objective based on the deviation utilizing a simple linear or non-linear regression using known mathematical forms. In some embodiments, the treatment blend model 226 can utilize machine learning to determine the probability of achieving one or more job objectives. The output from the treatment blend model 226 of the design process 200 can comprise a cement blend, a spacer fluid, a wellbore treatment, or combinations thereof and a probability of achieving at least one job objective based on simulation results of the treatment blend model 226.

The output of the treatment blend model 226 may be an input into another model within the model group 242, for example, the wellbore hydraulics model 228. The wellbore hydraulics model 228 can simulate the placement of the cement slurry within the wellbore and generate the pumping procedure. The simulation of the placement of the cement slurry can include the equivalent circulating density (ECD), a top of cement (TOC) requirement, a displacement efficiency, or combinations thereof. For example, the wellbore hydraulics model 228 can predict the pumping pressure required for the placement of the wellbore treatment. In a scenario, the wellbore hydraulics model 228 can generate a pumping procedure with pumping pressure values less than the fracture gradient of the formation to avoid wellbore treatment fluid losses to the formation. In another scenario, the wellbore hydraulics model 228 can determine the pump pressure for placement of the wellbore treatment is below the pore pressure of the formation which would allow an undesirable ingress of wellbore fluids. The wellbore hydraulics model 228 can generate a pumping procedure that includes utilizing back pressure, e.g., pressure on the annular space, to increase the pumping pressure above the pore pressure, an increase in the density of the treatment fluid, or combinations thereof. The inputs for the wellbore hydraulics model 228 may include the wellbore path 216, the materials inventory 218 (e.g., tubulars), and one or more wellbore treatments. The wellbore path 216 can include a geothermal temperature profile of the wellbore, the fracture gradient of a formation, and properties of various fluids utilized during the cementing operation such as spacers. The pore pressure of the formation can be retrieved from the drilling fluid model 222 based on the ECD of the drilling mud. In some embodiments, the wellbore hydraulics model 228 can recommend the placement of a downhole tool from the inventory of downhole tools to reduce the operational pumping values, e.g., pressure or flow rate, below a threshold value. The output of the wellbore hydraulics model 228 can include the pumping procedure or one or more modifications to a pumping procedure comprising the volume of the various fluids, pump rates for the various fluids, and eccentricity requirements. The wellbore hydraulics model 228 can determine a probability of achieving a job objective based on the pumping procedure or based on a deviation, e.g., a change in the wellbore environment, and utilizing a simple linear or non-linear regression using known mathematical forms. The output of the wellbore hydraulics model 228 can include a probability value for achieving a job objective based on simulation results of the wellbore hydraulics model 228.

In some embodiments, the wellbore hydraulics model 228 can include a displacement model. The displacement model, also called a fluid displacement efficiency model, can determine the placement of the wellbore treatment, e.g., cement slurry, within the annular space (annulus 342 of FIG. 3) between the casing string and the wellbore. The output from the wellbore hydraulics model 228 and the treatment model can be inputs into the displacement model. The displacement model can determine a predicted value of the pump pressure as a function of time within the casing string and the annular space based on the wellbore path, the dimensions of the casing string, any manipulation of the casing string, an inventory of downhole tools, the wellbore environment, and the fluid properties of the wellbore treatment (e.g. cement slurry), the spacer fluids, or combinations thereof. The dimensions of the casing string can include the outside diameter, inside diameter, and eccentricity. The manipulation of the casing string can include casing movement such as rotation of the casing string. The downhole tool inventory may include wiper plugs to separate the cement slurry from the spacer fluids and casing centralizers to minimize the eccentricity of the casing string within the wellbore. The fluid properties can include fluid rheology, density, and any mixing of fluids. The displacement model can determine the displacement of the drilling fluids from the annular space, any mixing of the cement slurry with the drilling fluids, the placement of the cement within the annular space, and the top of cement (TOC) between the casing string and the wellbore. The displacement model can be a separate model from the wellbore hydraulics model 228, included with the model 228, or combined with the model 228.

In some embodiments, the model group 242 can include a bond log prediction model. The bond log prediction model can determine an estimate of isolation barrier integrity, zonal isolation, bonding to the casing string, or combinations thereof. The bond log prediction model can output a predicted value of the bonding of the cement slurry to the casing string based on the probability of the placement of the cement slurry within the annular space (annulus 342 of FIG. 3) between the casing string and the wellbore and the probability of mixing of the cement slurry with the wellbore fluids. For example, the bond log prediction model may output a predicted value indicative of a poor cement bond due to drilling fluid contamination. In another scenario, the bond log prediction model may output a predicted value indicative of no cement bond due to the lack of cement slurry at a target location. In still another scenario, the bond log prediction model may output a value indicative of a good cement bond for an isolation barrier within a target location.

Although the design process 200 is described as a linear process that steps from model to model, for example, drilling fluid model 222 to isolation barrier model 224, it is understood that the design process 200 can be iterative, linear, or combinations thereof. For example, the design process 200 may step from wellbore hydraulics model 228 back to the treatment blend model 226 to iterate the job design 234, e.g., the cement blend and pumping procedure, until the simulation results for both models are below a threshold. The design process 200 may iterate a wellbore treatment design between two or more models. In a scenario, the design process 200 may iterate a design for a spacer fluid blend between the drilling fluid model 222 and the wellbore hydraulics model 228 until the simulation results for both models are below a threshold.

In an embodiment, the model group 242 may comprise at least two models, for example, the drilling fluid model 222 and the wellbore hydraulics model 228. For example, the design process 200 may exclude the isolation barrier model 224 and the treatment blend model 226 when simulating a pumping operation with a known wellbore treatment blend design. The design process 200 may exclude at least one model from the model group 242 depending on the design requirements for a wellbore treatment. For example, the model group 242 utilized for a fluid loss treatment design may exclude the treatment blend model 226.

The results of the modeling group can include a job design and set of design simulation results for the job design. The output of the design model group 242 comprises a set of design simulation results 230 for the job design, e.g., wellbore treatment blend. For example, the set of design simulation results 230 can comprise maximum pumping pressure based on the ECD from the drilling fluid model 222, a future well barrier strength from the isolation barrier model 224, a treatment blend from the treatment blend model 226, and a pumping procedure for the placement of the wellbore treatment per the wellbore hydraulics model 228. The set of design simulation results 230 can include expected wellbore environment changes based on the volume of wellbore treatment pumped. For example, the set of design simulation results 230 can include a plurality of expected casing pressures and wellbore pressures after a portion of the wellbore treatment is pumped, e.g., 10%, 20%, 30%, etc.

The modeling group 242 can generate a probability value for achieving the job objective, e.g., TOC, based on the simulation results. In some embodiments, the group probability value can be a function, e.g., a summation, of the probability values generated by each model, e.g., the drilling fluid model 222. The group probability value can include a placement probability, a treatment consistency probability, a short term barrier probability, a long term barrier probability, or combinations thereof. The placement probability comprises the ability to place the wellbore treatment without damaging the formation (e.g., fluid losses), without ingress of formation fluids (e.g., a kick), the placement of the wellbore treatment at the target location (e.g., cement within the annular space), or combinations thereof. The treatment consistency probability comprises placing a consistent treatment at the target location without diluting the treatment by contamination from other fluids (mixing with drilling fluids) and without the cement slurry beginning the curing process, e.g., prematurely setting. The short term barrier probability comprises the ability of the wellbore treatment to form a seal to prevent fluid communication. For example, a fluid loss treatment can prevent fluid loss to the formation or a cement slurry to prevent inter-zonal communication during the curing process. The long term barrier probability comprises the isolation barrier, e.g., cured cement, to withstand a predicted future stress state from changes to the wellbore environment, e.g., a reduction in the formation pressure. In some embodiments, the function comprises a plurality of weighting values applied to at least one of the probability values.

At step 232, if the design simulation results 230 are below a threshold value, the design process 200 may apply a constraint, e.g., a requirement for a lighter density, and return to the model group 242, e.g., isolation barrier model 224, for with a revision to the job design. For example, the first cement blend can be iterated to a second cement blend and one or more models can generate a set of simulation results. The design simulation results 230 can also comprise a probability achieving the job objective. The probability can be compared to a threshold value. Each of the models in the model group 242 can have a unique threshold value or a shared threshold value. For example, a shared threshold value can be the pore pressure for the formation for the drilling fluid model 222 and the wellbore hydraulics model 228. The threshold values for the drill fluid model can include the ECD, the formation pore pressure, and maximum circulation rate. The threshold values for the isolation barrier model can include a stress state of the wellbore isolation barrier, an interface bond strength between the formation and casing, near wellbore stress, or combinations thereof. The threshold values for the cement blend 408 comprise the mechanical properties (e.g., elastic modulus, strength, friction angle, poisons ratio, shrinkage, thermal properties, thickening time, fluid loss, gel strength, rheology, and/or density). The threshold values for the hydraulics model include the pumping procedure, formulation strength, formation pore pressure, circulation limits, thickening time, fluid loss, gel strength, or combinations thereof. Other threshold values may include customer requirements including downhole equipment such as centralizers (number, type and locations), the use of an inner string, multi-stage equipment requirements, or combinations thereof. The threshold values may include requirements for the spacer fluid comprising compatibility with cement and mud, density, rheology, ability to invert the emulsified mud, ability to clean the wellbore, or combinations thereof. If the set of design simulation results are below a threshold value and the design process has generated more than one revision to the cement blend, e.g., a fifth, sixth, or seventh cement blend, the design process 200 may generate a failure report and notify one or more user devices of the failure report.

A job design 234 may be generated by the design process 200 if the design simulation results 230 are above a threshold value at step 232. The job design 234 may be an embodiment of the job design 110 of FIG. 1. The job design 234 may comprise the wellbore treatment blend, the cement blend, the pumping procedure, an inventory of wellbore treatment materials, an inventory of assigned pumping units, an inventory of downhole tools, an inventory of various chemicals, or combinations thereof.

At step 236, the design process 200 may generate a verification testing request including the current revision of the cement blend and the wellbore design constraints, e.g., wellbore temperature and stress limits. The laboratory verification on the cement blend can include thickening time, fluid loss, mixability, stability of formulation, mechanical properties, and strength. The mechanical properties of the cement blend can include shrinkage, bond strength, gel strength, density, or combinations thereof. The verification testing, e.g., laboratory testing, may be completed consecutively or concurrently to the flow of the design process 200. The results of the verification testing can be transmitted to the database, the storage device 220, or combinations thereof.

At step 238, the design process 200 may generate a cementing proposal. The cementing proposal may comprise the job design 234.

Figure 3:
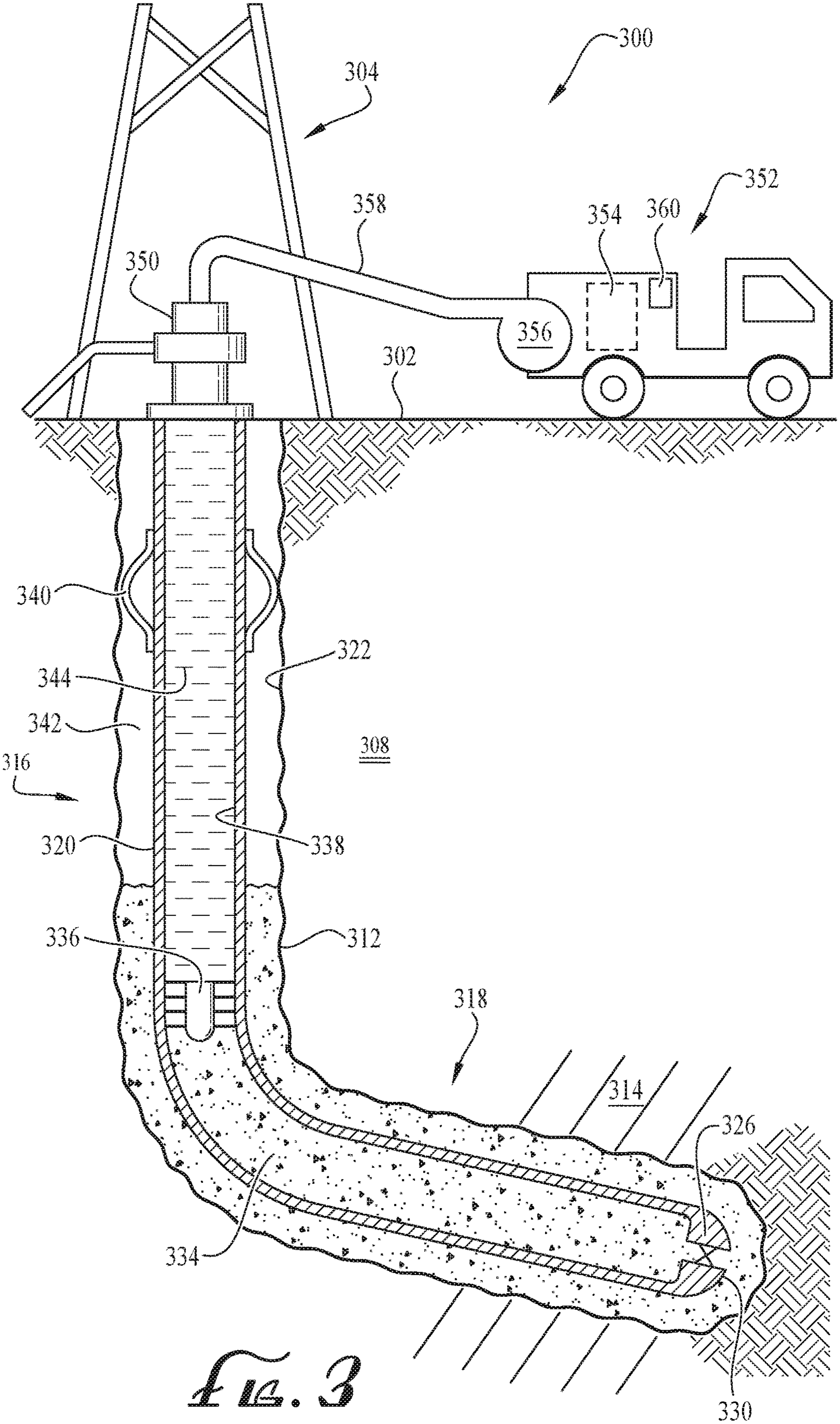
FIG. 3 is a cut-away illustration of a primary cementing operation according to an embodiment of the disclosure.

The job design 234 can be transported out to a remote wellsite with the assigned pumping equipment to perform a pumping operation. Turning now to FIG. 3, a wellbore treatment operation 300 utilizing the job design 234 is illustrated. In some embodiments, the wellsite may be on land and the job design 234, e.g., cement blend and inventory of pump units 352, is optimized for a wellsite on land. In some embodiments, the wellsite may be offshore and the job design 234 is optimized for a wellsite offshore. For example, the pump unit 352 utilized offshore may be skid mounted whereas the pump unit 352 utilized on land may be truck mounted.

A casing string 320 can be conveyed into the wellbore 312 by the drilling rig 304, a workover rig, an offshore rig, or similar structure. A wellhead 350 may be coupled to the casing string 320 at surface 302. The pump unit 352, located offshore or on land, can be fluidically coupled to a wellhead 350 by a supply line 358. The wellbore 312 can extend in a substantially vertical direction away from the earth's surface 302 and can be generally cylindrical in shape with an inner bore 322. At some point in the wellbore 312, the vertical portion 316 of the wellbore 312 can transition into a substantially horizontal portion 318. The wellbore 312 can be drilled through the subterranean formation 308 to a hydrocarbon bearing formation 314. Perforations made during the completion process that penetrate the casing 320 and hydrocarbon bearing formation 314 can enable the fluid in the hydrocarbon bearing formation 314 to enter the casing 320.

In some embodiments, the pump unit 352, also called a cementing unit, comprises a mixing system 354, a pumping mechanism 356, and a unit controller 360. The mixing system 354 can mix the cement blend with a liquid, e.g., water, to form a cement slurry 334. The pumping mechanism 356 can deliver the cement slurry 334 from the mixing system 354 to the wellbore 312 via the supply line 358. The unit controller 360 may be a computer system suitable for communication with the service personnel and control of the mixing system 354 and the pumping mechanism 356 as will be described further herein.

In some embodiments, the wellbore 312 can be completed with a cementing process that follows a cementing pumping procedure to place a cement slurry 334 between the casing string 320 and the wellbore 312. The wellhead 350 can be any type of pressure containment equipment connected to the top of the casing string 320, such as a surface tree, production tree, subsea tree, lubricator connector, blowout preventer, or combination thereof. The wellhead 350 can include one or more valves to direct the fluid flow from the wellbore and one or more sensors that measure pressure, temperature, and/or flowrate data. The pump unit 352 can follow a pumping procedure with multiple sequential steps to mix a cement blend with water to form a cement slurry 334 and place the cement slurry 334 into the annular space 342. The pumping procedure can include steps of pumping a spacer fluid to separate the drilling fluid, e.g., drilling mud, from the cement slurry 334. The pumping procedure can include instruction for downhole tools, for example, releasing and pumping a cementing wiper plug 336, or similar downhole equipment, to physically separate the drilling fluid from the cement slurry 334. The wiper plug 336 comprises a plurality of flexible fins, or wipers, that sealingly engage the inner surface 338 of the casing 320 with a sliding fit. The pump unit 352 can pump a predetermined volume of cement slurry 334 though the supply line 358, the wellhead 350, and into the casing string 320. A volume of spacer fluid 344 or other type of completion fluid can be pumped after the cementing wiper plug 336 to displace the cementing wiper plug 336 down the casing string 320. The cementing wiper plug 336 can push the cement slurry 334 out the float shoe 326 (or other suitable primary cementing equipment), and into the annular space 342 between the casing string 320 and the wellbore 312. In some embodiments, various downhole equipment can be included in the pumping procedure, for example, a plurality of centralizers 340 can be coupled to the casing string 320 to maintain the annular gap within the annular space 342 between the casing string 320 and the wellbore 312. In other embodiments, however, the casing string 320 may be omitted from all or a portion of the wellbore 312 and the principles of the present disclosure can equally apply to an "open-hole" environment. In still other embodiments, however, the primary cementing equipment, e.g., float shoe 326, at the end of the casing string 320 can be drilled out and a liner can be added to extend the length of the wellbore 312.

Figure 4:
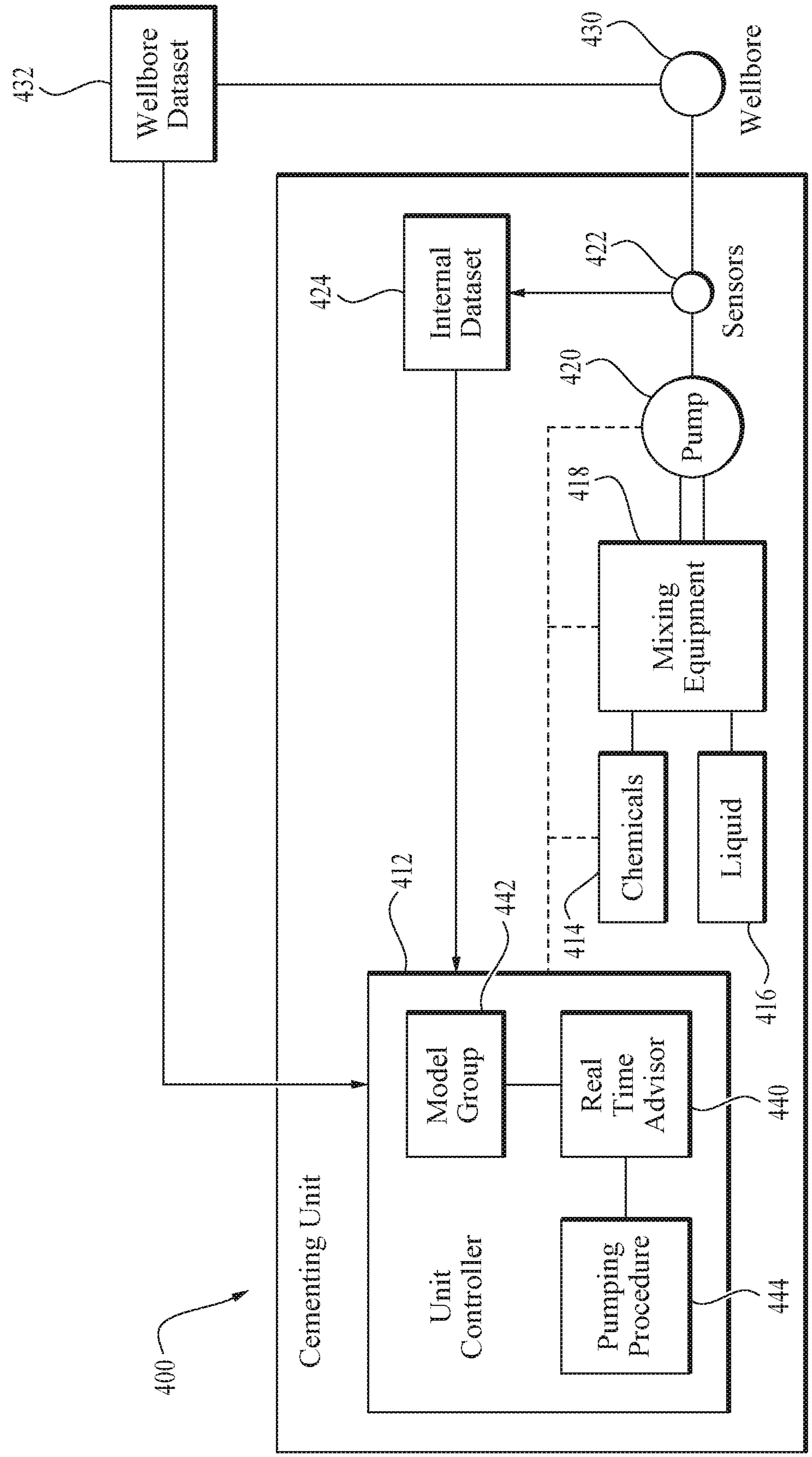
FIG. 4 is an illustration of a cementing unit according to an embodiment of the disclosure.

A method of controlling the cementing operation to modify a pumping procedure due to changes in the wellbore environment can include unit level control for each pumping unit. Turning now to FIG. 4, a pumping unit 400 fluidically connected to the wellbore 430 via the supply line is illustrated. The cementing unit 400 can be an embodiment of the pump unit 352 of FIG. 3. The cementing unit 400 comprises a unit controller 412, a chemical dispenser 414, a liquid supply 416, a mixing equipment 418, a pumping mechanism 420, and a sensor array 422. The chemical dispenser 414 comprises a volume of chemicals for modification of the cement slurry, e.g., cement retarder, and dispenser pump. The liquid supply 416 may be a volume of liquid (e.g., a tank) or a water supply line fluidically connected to the cementing unit 400. The mixing equipment 418 can comprise a single mixing tub or dual mixing tubs. The pumping mechanism 420 can include a power end, e.g., motor and transmission, a fluid end, e.g., plunger pump or centrifugal pump, or combinations thereof. The sensor array 422 can provide an internal dataset 424 indicative of the pumping operation. The unit controller 412 can be communicatively connected to the chemical dispenser 414, the liquid supply 416, the mixing equipment 418, the pumping mechanism 420, and sensor array 422.

The wellbore 430 can be an embodiment of the wellbore 312 of FIG. 3 and be described by the sensor data 214 and wellbore path 216 of FIG. 2. In some embodiments, a wellbore dataset 432 comprises a periodic dataset indicative of the pumping operation from sensors fluidically coupled to the wellbore. The periodic dataset can comprise a treatment pressure, a treatment flowrate, a density of the treatment fluid, or combinations thereof. The sensors may be coupled to the supply line (e.g., supply line 358), the wellhead (e.g., wellhead 350), to the wellbore (e.g., wellbore 312), coupled to the casing (e.g., casing string 320), within the wellbore, or combinations thereof. The wellbore dataset 432 can be retrieved by the unit controller 412, transmitted to the unit controller 412, or combinations thereof.

An advisory process 440, e.g., real time advisor, executing on the unit controller 412 can receive an instruction from the pumping procedure 444 and direct the mixing equipment 418 and pumping mechanism 420 to deliver a wellbore treatment to the wellbore 430 per the pumping procedure. In some embodiments, the advisory process 440 can retrieve a wellbore dataset 432 indicative of the wellbore environment and an internal dataset indicative of the wellbore treatment. The wellbore dataset 432 can comprise the wellbore environments reaction to the wellbore treatment delivered via the cementing unit 400. The advisory process 440 can utilize a model group 442 to simulate the wellbore environment reaction to the treatment fluid. The model group 442 can be an embodiment of the model group 132 of FIG. 1 and/or the model group 242 of FIG. 2. The advisory process 440 can generate a set of model inputs from the wellbore dataset 432 and the internal dataset 424. For example, the advisory process 440 may select a formation pressure from the wellbore dataset 432 and a density of the treatment fluids from the internal dataset 424. The advisory process 440 can compare the simulation results from the model group 442 to the simulation results from the model group 242 of FIG. 2 to determine a change in the wellbore environment. The advisory process 440 can modify the pumping procedure in response to the change in the wellbore environment as will be described further herein.

Figure 5:
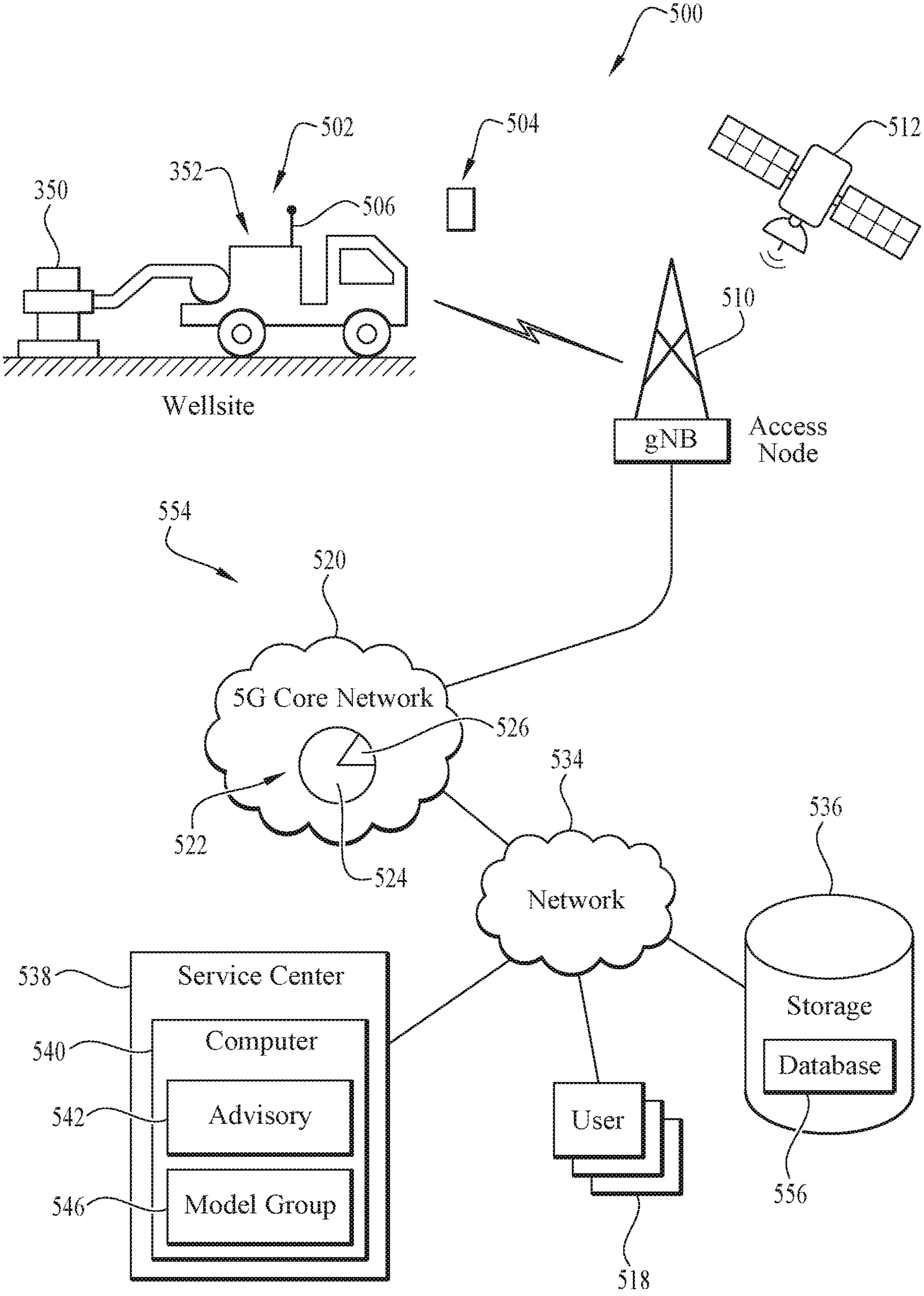
FIG. 5 is a block diagram of a communication system according to an embodiment of the disclosure.

The modeling group 442 accessed by the advisory process 440 can be located on the cementing unit 400 or on a remote computer system. Turning now to FIG. 5, a data communication system 500 is illustrated. In some embodiments, the data communication system 500 comprises a remote wellsite 502 (where the pump unit 352 of FIG. 3 can be located), an access node 510 (e.g., cellular site), a mobile carrier network 554, a network 534, a storage computer 536, a service center 538, a plurality of user equipment (UE) 504, and a plurality of user devices 518. A remote wellsite 502 can include a pump unit 352, e.g., cementing unit 400, as part of a wellbore treatment operation pumping a service fluid into the wellhead (e.g., wellhead 350 in FIG. 3). The pump unit 352 can include a unit controller communicatively connected to a communication device 506 (e.g., transceiver) that can transmit and receive via any suitable electronic communication means (wired or wireless), for example, wirelessly connect to an access node 510 to transmit data (e.g., wellbore dataset 432) to a storage computer 536. The storage computer 536 may also be referred to as a data server, data storage server, or remote server. The storage computer 536 may include a database 556 comprising job design data. Wireless communication can include various types of radio communication, including cellular, satellite 512, or any other form of long range radio communication. The communication device 506 may communicate via electronic communication comprising a combination of wireless and wired communication. For example, communication device 506 may wirelessly connect to access node 510 that is communicatively connected to a network 534 via a mobile carrier network 554.

In some embodiments, the unit controller on the pump unit 352 is communicatively connected, via the communication device 506, to the mobile carrier network 554 that comprises the access node 510, a 5G core network 520, and a portion of the network 534. The communication device 506 may be a radio transceiver connected to a computer system at the wellsite, for example, the unit controller 360 of FIG. 3, thus the communication device 506 may be communicatively connected to the unit controller 360 of the pump unit 352.

The UE 504 may be a communication device provided to the service personnel. In some embodiments, the UE 504 may be a computer system such as a cell phone, a smartphone, a wearable computer, a smartwatch, a headset computer, a laptop computer, a tablet computer, or a notebook computer. The UE 504 may be a virtual home assistant that provides an interactive service such as a smart speaker, a personal digital assistant, a home video conferencing device, or a home monitoring device. The UE 504 may be an autonomous vehicle or integrated into an autonomous vehicle. For example, the UE 504 may be an autonomous vehicle such as a self-driving vehicle without a driver, a driver assisted, an application that maintains the vehicle on the roadway with no driver interaction, or a driver assist application that adds information, alerts, and some automated operations such as emergency braking. The UE 504 may be the unit controller, e.g., unit controller 412 on cementing unit 400, or a computer system communicatively connected to the pump unit 352. In some embodiments, the UE 504 can be a computer system located at the wellsite.

The access node 510 may also be referred to as a cellular site, cell tower, cell site, or, with 5G technology, a gigabit Node B. The access node 510 can establish wireless communication links to the communication device 506 and UE 204 according to a 5G, a long term evolution (LTE), a code division multiple access (CDMA), or a global system for mobile communications (GSM) wireless telecommunication protocol.

The satellite 512 may be part of a network or system of satellites communicatively connected that form a network. The satellite 512 may communicatively connect to the UE 504, the communication device 506, the access node 510, the mobile carrier network 554, the network 534, or combinations thereof. The satellite 512 may communicatively connect to the network 534 independently of the access node 510.

The 5G core network 520 can be communicatively coupled to the access node 510 and provide a mobile communication network via the access node 510. The 5G core network 520 can include a virtual network (e.g., a virtual computer system) in the form of a cloud computing platform. The cloud computing platform can create a virtual network environment from standard hardware such as servers, switches, and storage. The total volume of computing availability 522 of the 5G core network 520 is illustrated by a pie chart with a portion illustrated as a network slice 526 and the remaining computing availability 524. The network slice 526 represents the computing volume available for storage or processing of data. The cloud computing environment is described in more detail further hereinafter. Although the 5G core network 520 is shown communicatively coupled to the access node 510, it is understood that the 5G core network 520 may be communicatively coupled to a plurality of access nodes (e.g., access node 510), one or more mini-data center (MDC) nodes, or a 5G edge site. The 5G edge site may also be referred to as a regional data center (RDC) and can include a virtual network in the form of a cloud computing platform. Although the virtual network is described as created from a cloud computing network, it is understood that the virtual network can be formed from a network function virtualization (NFV). The NFV can create a virtual network environment from standard hardware such as servers, switches, and storage. The NFV is more fully described by ETSI GS NFV 002 v1.2.1 (December 2014).

The network 534 may be one or more private networks, one or more public networks (e.g., the Internet), or a combination thereof. The network 534 can be communicatively coupled to the 5G core network 520 and the cloud network platform.

The service personnel can retrieve a job design with the UE 504 from the database 556 on the storage computer 536. In some embodiments, the UE 504 and the unit controller 360 on the pump unit 352 can be referred to as a computer system at the remote wellsite 502. In some embodiments, the computer system 540 at the service center 538, the user devices 518, the storage computer 536, and the VNF on the network slice 526 can be referred to as a remote computer system. In some embodiments, the service personnel can communicatively connect computer system at the wellsite, e.g., the UE 504, to a remote computer system, e.g., computer system 540 at the service center via the mobile carrier network 554, the network 534, or combinations thereof. For example, the unit controller 360 on the pump unit 352 can connect to the storage computer 536 via the mobile carrier network 554 and/or the network 534. In another scenario, the user devices 518 can connect to the UE 504 via the network 534 and/or mobile carrier network 554.

The computer system 540 can be a computer system, a server, a workstation, a laptop, or any type of suitable computer system. The computer system 540 may be an embodiment of the computer system from job design 110 of FIG. 1 and/or the computer system utilized for the design process 200 of FIG. 2. The database 556 on the storage computer 536 can be an embodiment of the database 122 on the storage computer 120 of FIG. 1 and/or the database and storage device 220 of FIG. 2.

An advisory process 542 executing on the computer system 540 at the service center 538 can be communicatively coupled with a model group 546. The model group 546 executing on the computer system 540 can be an embodiment of the design model group 130 on FIG. 1 and/or model group 242 on FIG. 2. The advisory process 542 can be an embodiment of the design process 200 of FIG. 2 or the advisory process 440 on the unit controller 412 of the cementing unit 400 of FIG. 4.

In an embodiment, an engineer utilizing a user device 518 can generate a job design 110, e.g., job design 234, with the advisory process 542, e.g., design process 200, executing on the computer system 540. The advisory process 542, e.g., design process 200, can utilize a model group, for example, model group 130 from FIG. 1, model group 242 from FIG. 2, or model group 546 from FIG. 5. The job design 110 can be stored in the database 122 on the storage computer, for example the storage computer 120, the storage device 220, or storage computer 536. The job design 110 can be retrieved from a remote computer system, e.g., computer system 540, by a computer system at the wellsite, e.g., UE 504.

In an embodiment, the advisory process, e.g., advisory process 440 of FIG. 4, executing on a computer system at the wellsite, e.g., unit controller 412 of FIG. 4, can communicatively connect to a model group, e.g., model group 546, on a remote computer system. For example, the advisory process executing on the unit controller of the pump unit 352 at the remote wellsite 502 can communicatively connect to the model group 546 on the computer system 540 of the service center 538. In another scenario, the advisory process executing on the unit controller of the pump unit 352 at the remote wellsite 502 can communicatively connect to a model group, e.g., model group 242, on the network slice 526 of the 5G core network 520.

In some embodiments, the advisory process can be executing on a first processor and the pumping model group 132 can be executing on a second processor at the wellsite 502. The design process, e.g., design process 200, can be executing on a third processor and the design model group 130 can be executing on a fourth processor. In some embodiments, the first processor and the second processor can be on the same computer at the wellsite. In some embodiments, the first processor and the second processor can be on different computers at the wellsite. In some embodiments, the third processor and the fourth processor can be on the same computer remote from the wellsite. In some embodiments, the third processor and the fourth processor can be on different computers remote from the wellsite. In some embodiments, the first processor, the second processor, the third processor, and the fourth processor can be on the same computer i) at the wellsite or ii) remote from the wellsite. In some embodiments, the advisory process can be executing on a computer system at the wellsite and the design process 200, design model group 130, and pumping model group 132 can be executing on a computer system remote from the wellsite. In some embodiments, the advisory process can be executing on a computer system at the wellsite and the design process 200, design model group 130, pumping model group 132, or combinations thereof can be executing on a computer system at the wellsite or remote from the wellsite.

Figure 6:
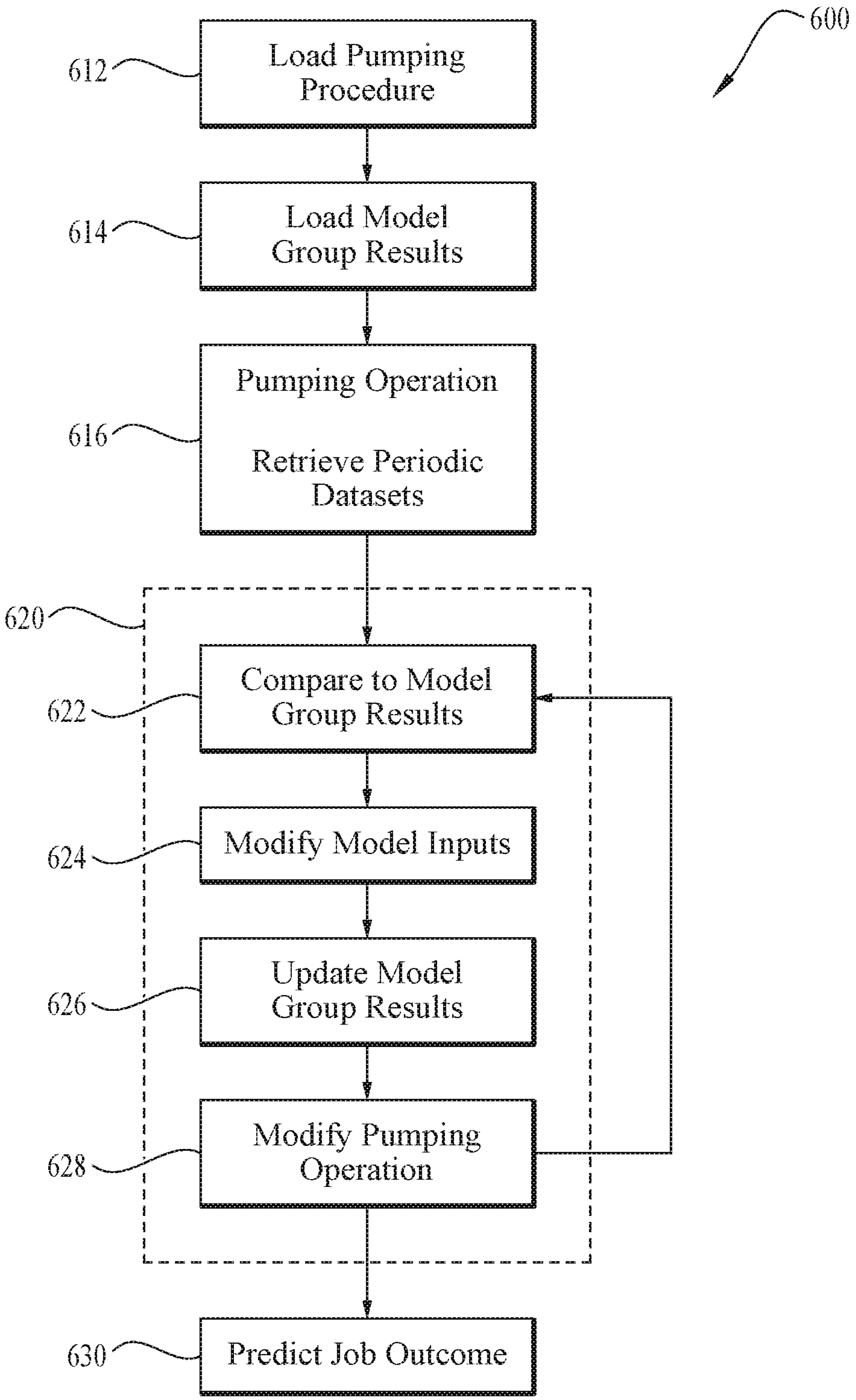
FIG. 6 is a logical flow diagram of a method to determine a probability of job outcome according to an embodiment of the disclosure.

The advisory process 440 on the cementing unit 400 can detect unplanned changes in a wellbore pumping operation from sensor data and utilize a group of models to provide a probability of successful cement placement. Turning now to FIG. 6, a method 600 for determining a probability of job outcome is illustrated with a logical flow diagram. At step 612, the advisory process 440 can input the pumping procedure 444. In some embodiments, the advisory process 440 can retrieve the pumping procedure 444 from a computer system at the wellsite, for example, from memory. In some embodiments, the advisory process 440 can retrieve the pumping procedure 444 from a remote computer system, e.g., the VNF.

At step 614, the advisory process 440 can retrieve the design simulation results generated during the job design, e.g., job design 110. In some embodiments, the advisory process 440 can retrieve the design simulation results from a computer system at the wellsite. In some embodiments, the advisory process 440 can retrieve the design simulation results from a remote computer system. In some embodiments, the advisory process 440 can generate the design simulation results by inputting the design inputs into the model group 442.

At step 616, the advisory process 440 can retrieve periodic datasets indicative of the pumping operation. In some embodiments, the advisory process 440 can direct the pumping operation per the pumping procedure 444. In some embodiments, a managing process can direct the pumping operation concurrently to the advisory process 440. In some embodiments, the periodic datasets comprise internal dataset 424, wellbore dataset 432, or combinations thereof.

At step 622, the advisory process 440 can utilize a monitoring process 620 to determine a change in the wellbore environment by comparing the periodic datasets to the design simulation results. The monitoring process 620 can be an embodiment of the real time advisor 440 from FIG. 4. In some embodiments, the periodic datasets, e.g., the wellbore dataset 432, can deviate from the design simulation results. The design simulation results can provide at least one operational threshold values for the pumping operation. The advisory process 440 and/or the monitoring process 620 to compare the periodic datasets to the operational threshold values. In some embodiments, the operational threshold values may be a single value, e.g., a maximum value, or a range of threshold values. The advisory process 440 can return to the previous step if a change is not detected. The advisory process 440 can advise the operating personnel of a detected change in the wellbore environment.

At step 624, the advisory process 440 can modify the model inputs from the periodic dataset indicative of the pumping operation. In some embodiments, the advisory process 440 and/or the monitoring process 620 can generate a set of model inputs comprising the periodic dataset, e.g., the wellbore datasets 432. The advisory process 440 can generate a set of model inputs in response to detecting a change in the wellbore environment from the previous set. In some embodiments, the advisory process 440 may generate subsequent sets of model inputs based on a volume of the treatment pumped, a time based interval, the stage of the pumping procedure, the portion of the stage pumped, the portion of the stage remaining, or combinations thereof. For example, the advisory process 440 can generate a set of model inputs for each barrel of treatment fluid pumped into the wellbore. In another example, the advisory process 440 can generate a set of model inputs every two minutes of the pumping operation.

At step 626, the model group 442 can generate a set of pumping simulation results from the set of model inputs. The advisory process 440 and/or the monitoring process 620 can input the set of model inputs from the previous step into the model group 442. The output from the model group 442 can comprise a set of pumping simulation results, an identification of the wellbore change, and a probability of achieving a job objective. The model group 442 can identify a change in the wellbore condition based on the pumping simulation results. For example, the model group 442 can identify a high pressure zone from an increase in wellbore pressure and an increase in volume flowrate of fluid returning to surface. In another scenario, the model group 442 can identify a low pressure zone within the formation from a decrease in wellbore pressure and a decrease in the volume flowrate of fluid returning to surface. In still another scenario, the model group 442 can identify a washout, e.g., a section of the wellbore with larger diameter than designed, by a deviation of both the tubing pressure and annular pressure from the design simulation results. In yet another scenario, the model group 442 can determine a cave-in, e.g., a partial collapse of the inner wall of the wellbore onto the casing by a deviation of both the tubing pressure and annular pressure from the design simulation results. In yet another scenario, the model group 442 can determine a pack-off from debris within the annulus 342. For example, debris from the wellbore 312 can collect about a casing centralizer 340 causing higher (or in some cases intermittent higher) than predicted pumping pressures and/or wellbore pressures. The modeling group 442 can determine a probability value of achieving the job objective based on the pumping simulation results. The probability value can be determined by comparing the change in the pumping operation caused by the wellbore environment to the predicted pumping operation, e.g., pumping procedure. The change in the wellbore environment can be a set of inputs into the model group 442 to determine a modified wellbore treatment, a modified pumping procedure, and a probability value. The probability value can be a function of probability values, e.g., long term barrier, generated by individual models within the model group 442.

At step 628, the advisory process 440 can modify the pumping operation based on the change to the wellbore environment. In some embodiments, the advisory process 440 and/or the monitoring process 620 can determine a modification to the job design, e.g., job design 110, based on the identification of the change in the wellbore condition. For example, the advisory process 440 can modify the job design 110 to blend a new wellbore treatment, e.g., a heavy weight pill, in response to identification of a high pressure zone. In another scenario, the advisory process 440 can blend and pump a wellbore treatment, e.g., a fluid loss treatment, in response to identification of a low pressure zone. In still another scenario, the advisory process 440 can change a volume target for a wellbore treatment, e.g., a larger volume of cement slurry, in response to identification of a washout. In yet another scenario, the advisory process 440 can change a fluid blend for a wellbore treatment, e.g., add a friction reducer to the cement slurry, in response to identification of a cave-in. The advisory process 400 can modify the pumping procedure in response to a change in the wellbore environment. For example, the advisory process 400 can apply a back pressure (pressure to the annulus 342), change the applied pumping pressure and/or pumping rate of the wellbore treatment or subsequent spacer fluid, change the wellbore treatment blend and/or cement blend, add additional wellbore treatments, cancel planned wellbore treatments, or combinations thereof.

At step 630, the advisory process 440 can alert the service personnel of a probability of a successful cement placement determined by the model group. In some embodiments, the advisory process 440 and/or the monitoring process 620 can receive a probability of a successful cement placement generated by the design model group 130, the pumping model group 132, the model group 442, or combinations thereof. The probability value can fluctuate during the pumping operation. For example, the probability value may be at 100% at the beginning of the job, decrease to 70% in response to the identification of a washout, and increase to 95% in response to the modifications to the job design and/or pumping procedures. The advisory process 440 can alert the service personnel of the final probability value at the end of the pumping operation.

Figure 7:
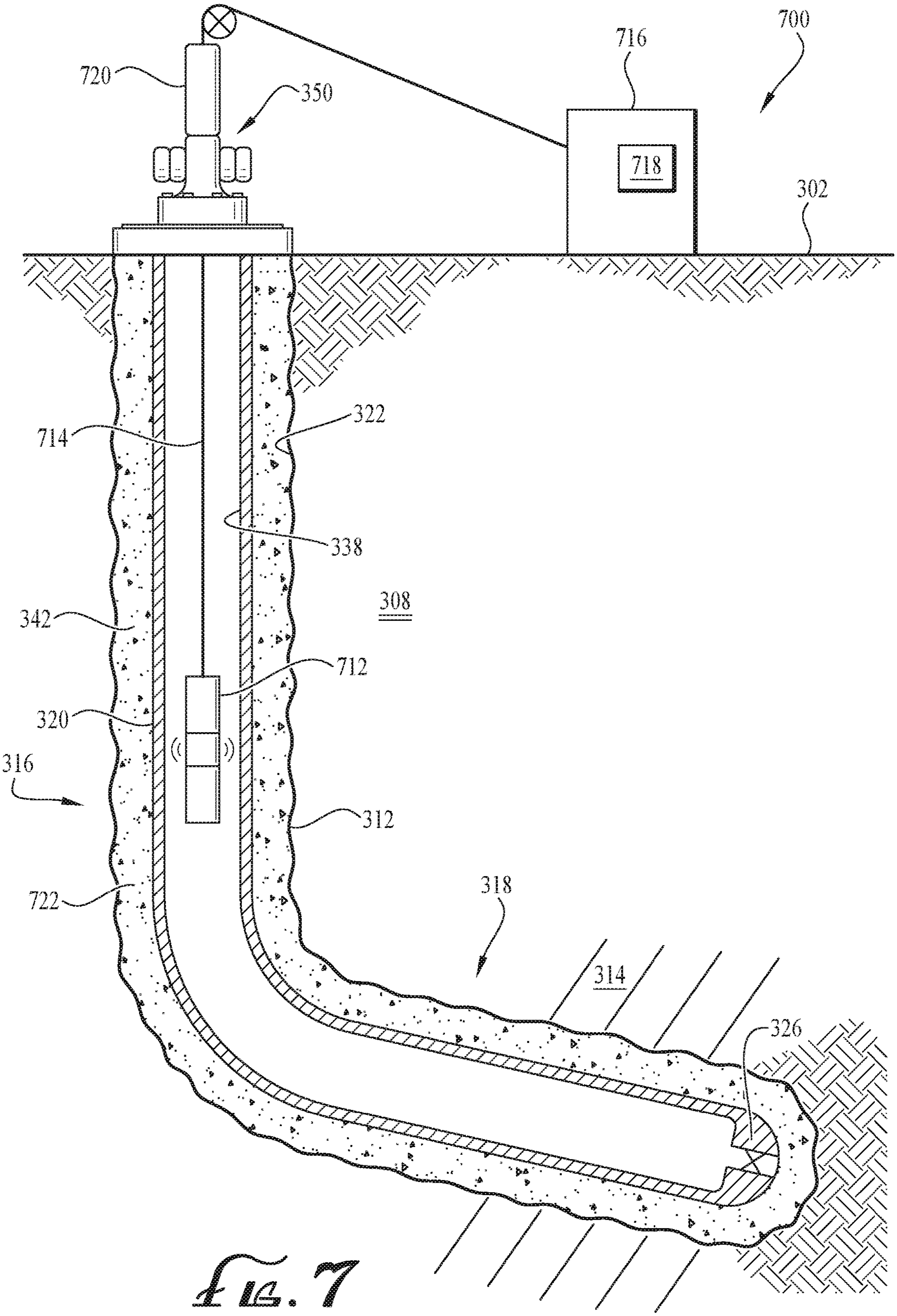
FIG. 7 is a cut-away illustration of a wellbore evaluation environment according to an embodiment of the disclosure.

Verification of the job objectives may require additional downhole tools and services to evaluate. For example, the evaluation of the cement bond to the casing, e.g., casing string 320 of FIG. 3, can require the conveyance of a wireline tool into the wellbore. Turning now to FIG. 7, a wellbore evaluation environment 700 for evaluating cement behind the casing is illustrated. In some embodiments, an acoustic logging tool 712 can be conveyed into the casing 320 by a work string 714. The acoustic logging tool 712 is illustrated as evaluating the isolation barrier, e.g., cured cement, behind the casing string 320 of the wellbore treatment operation 300 illustrated in FIG. 3 and shares many of the same reference numbers. The work string 714 can be a wireline cable, coil tubing, or a tubing string with a conductor that electrically couples the acoustic logging tool 712 to a surface equipment 716. A lubricator 720 can couple to the wellhead 350 to sealingly engage the work string 714 and isolate the wellbore pressure. The acoustic logging tool 712 can be, for example, a cement bond log tool (CBL), an ultra-sonic imager (USI), or other type of cement scanner tool. The acoustic logging tool 712 may obtain measurements of amplitude and variable density from sonic acoustic waves, acoustic impedance from ultrasonic waves, or other types of measurements from acoustic echoes. These measurements can be transmitted to an evaluation application executing on a computer system 718 for analysis. Cement quality indicators may be derived from one or more of these measurements. For example, a cement bond log indicating the quality and consistency of the cement between the casing 320 and the wellbore 312 can be produced. In another scenario, the measurements from the acoustic logging tool 712 can indicate the TOC relative to the surface 302. The TOC can be one of the job objectives provided by the customer. The acoustic logging tool can determine the location of the TOC, for example, the depth of the isolation barrier 722 within the annular space 342. For example, some subterranean formations 308 may include an aquifer or other source of water and the job objective can be to place the TOC a predetermined distance above the aquifer. In another scenario, a job objective can be for TOC to cover a liner top, e.g., an overlap of an inner casing string to a primary casing string. In still another scenario, the job objective for the TOC can be to cover and seal at the surface 302. A successful cement bond log and/or TOC can be one of the job objectives.

The measurements from the acoustic logging tool 712 and/or the analysis made by the evaluation application on the computer system 718 can be transmitted to a storage computer, for example, the storage computer 120 in FIG. 1. With reference to FIG. 1, The job evaluation 116 can include the analysis of the isolation barrier 722 made by the evaluation application. The analysis of the isolation barrier 722 can also be included in the job report 118 produced by the service personnel at the end of the job.

Figure 8:
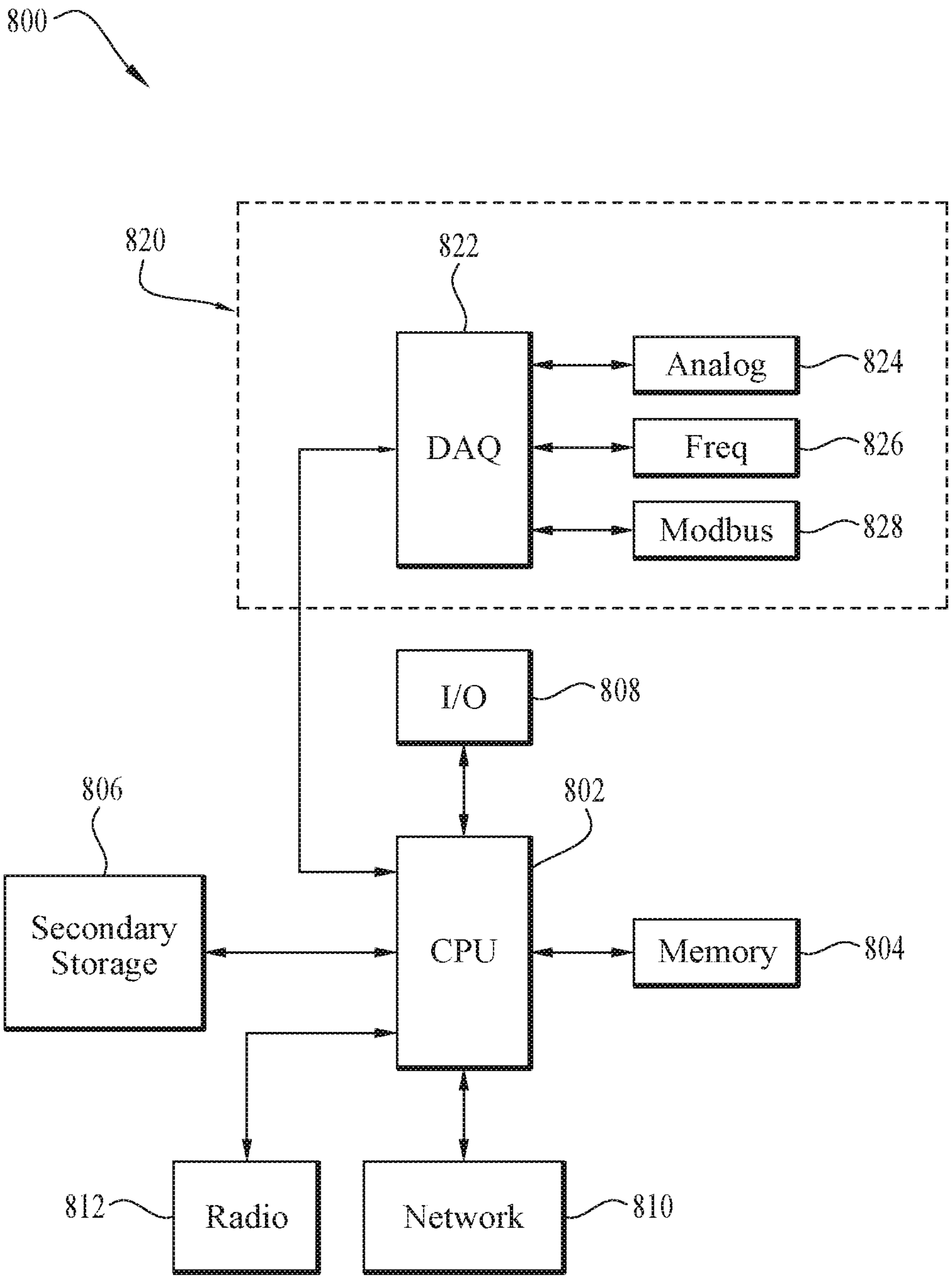
FIG. 8 is a block diagram of a computer system suitable for implementing one or more embodiments of the disclosure.

The computer system at the wellsite may be a computer system suitable for communication and control of the pumping equipment, e.g., a unit controller. The computer system located at a remote location may be a computer system suitable for communication and analysis of the pumping operation, e.g., a VNF on a network slice. In FIG. 1, the job design 110 can be performed on computer system with the design model group 130 executing on the same computer system, a networked computer system, or combinations thereof. The job operations 114 can be directed by a unit controller that establishes control over the pumping operations. A modeling group 132 can be executing on the same unit controller, a networked computer system, a remote computer system, or combinations thereof. In some embodiments, the unit controller 360 of FIG. 3 and the unit controller of 412 of FIG. 4 may be an exemplary computer system 800 described in FIG. 8. Turning now to FIG. 8, a computer system 800 suitable for implementing one or more embodiments of the unit controller, for example, unit controller 360, including without limitation any aspect of the computing system associated with the pumping operation of FIG. 3 and the remote wellsite 502 of FIG. 5 and the cementing unit 400 of FIG. 4. The computer system 800 may be suitable for implementing one or more embodiments of the storage computer, for example, storage computer 120 of FIG. 1, storage device 220 of FIG. 2, and storage computer 536 of FIG. 5. The computer system 800 may be suitable for implementing one or more embodiments of the computer system in FIG. 5, for example, the computer system 540, cloud computing, the VNF on the network slice 526, a plurality of UE 504, and a plurality of user devices 518. The computer system 800 includes one or more processors 802 (which may be referred to as a central processor unit or CPU) that is in communication with memory 804, secondary storage 806, input output devices 808, and network devices 810. The computer system 800 may continuously monitor the state of the input devices and change the state of the output devices based on a plurality of programmed instructions. The programming instructions may comprise one or more applications retrieved from memory 804 for executing by the processor 802 in non-transitory memory within memory 804. The input output devices may comprise a Human Machine Interface with a display screen and the ability to receive conventional inputs from the service personnel such as push button, touch screen, keyboard, mouse, or any other such device or element that a service personnel may utilize to input a command to the computer system 800. The secondary storage 806 may comprise a solid state memory, a hard drive, or any other type of memory suitable for data storage. The secondary storage 806 may comprise removable memory storage devices such as solid state memory or removable memory media such as magnetic media and optical media, i.e., CD disks. The computer system 800 can communicate with various networks with the network devices 810 comprising wired networks, e.g., Ethernet or fiber optic communication, and short range wireless networks such as Wi-Fi (i.e., IEEE 802.11), Bluetooth, or other low power wireless signals such as ZigBee, Z-Wave, 6LoWPan, Thread, and WiFi-ah. The computer system 800 may include a long range radio transceiver 812 for communicating with mobile network providers.

In some embodiments, the computer system 800 may comprise a DAQ card 814 for communication with one or more sensors. The DAQ card 814 may be a standalone system with a microprocessor, memory, and one or more applications executing in memory. The DAQ card 814, as illustrated, may be a card or a device within the computer system 800. In some embodiments, the DAQ card 814 may be combined with the input output device 808. The DAQ card 814 may receive one or more analog inputs 816, one or more frequency inputs 818, and one or more Modbus inputs 820. For example, the analog input 816 may include a volume sensor, e.g., a tank level sensor. For example, the frequency input 818 may include a flow meter, i.e., a fluid system flowrate sensor. For example, the Modbus input 820 may include a pressure transducer. The DAQ card 814 may convert the signals received via the analog input 816, the frequency input 818, and the Modbus input 820 into the corresponding sensor data. For example, the DAQ card 814 may convert a frequency input 818 from the flowrate sensor into flow rate data measured in gallons per minute (GPM).

The systems and methods disclosed herein may be advantageously employed in the context of wellbore servicing operations, particularly, in relation to the design of a cement blend for a cement operation as disclosed herein.

In some embodiments, an advisory process 440 and/or a monitoring process 620 can receive a periodic dataset indicative of a pumping operation. The advisory process 440 and/or the monitoring process 620 can determine a change in the wellbore environment by comparing the periodic datasets to a set of design simulations. The monitoring process 620 can identify the change in the wellbore environment and a response to the identified change. The monitoring process 620 can modify the wellbore treatment, the pumping procedure, or combinations thereof in response to identifying the change. The advisory process can determine a probability of achieving a job objective with the modified wellbore treatment and/or pumping procedure utilizing a model group.

ADDITIONAL DISCLOSURE

The following are non-limiting, specific embodiments in accordance and with the present disclosure:

A first embodiment, which is a computer-implemented method of controlling a pumping operation of a wellbore treatment, comprising retrieving, by an advisory process executing on a first processor, a pumping procedure and a job objective for a wellbore treatment operation from a database, wherein the database is on a storage computer; retrieving, by the advisory process, a set of design simulation results from the database or from a design model group; retrieving, by the advisory process, a periodic dataset indicative of the pumping operation; generating, by a pumping model group executing on a second processor, a set of pumping simulation results and a probability of achieving a job objective in response to a set of model inputs; identifying, by the advisory process, an identification of a change in a wellbore environment from the set of pumping simulation results, wherein the advisory process is communicatively connected to the pumping model group via electronic communication; generating, by the advisory process, a modification to the pumping procedure in response to the identification of the change in the wellbore environment; and alerting, by the advisory process, a service personnel of a probability of achieving the job objective.

A second embodiment, which is the method of the first embodiment, further comprising comparing, by the advisory process, the periodic dataset to a set of operational threshold values; wherein the set of operational threshold values comprises the set of design simulation results; determining, by the advisory process, a deviation in response to a measurement from the periodic dataset exceeding at least one of the set of operational threshold values; identifying, by the advisory process, a change in the wellbore environment in response to the deviation; and generating, by the advisory process, a set of model inputs from the periodic dataset.

A third embodiment, which is the method of any of the first and the second embodiments, further comprising generating, by a design process executing on a third processor, a set of design model inputs from a wellbore dataset; retrieving, by the design model group executing on a fourth processor, the set of design model inputs; generating, by the design model group, a set of design simulation results and a probability value; and generating, by the design process, a job design in response to the set of design simulation results exceeding a threshold value.

A fourth embodiment, which is the method of the third embodiment, wherein the wellbore dataset comprises a set of customer inputs, a set of sensor data, a wellbore path, and a materials inventory; and wherein the job design comprises a wellbore treatment, a cement blend, a pumping procedure, an inventory of wellbore treatment materials, an inventory of assigned pumping units, an inventory of downhole tools, an inventory of chemicals, or combinations thereof.

A fifth embodiment, which is the method of the fourth embodiment, wherein the set of customer inputs comprises at least one job objective, wherein the set of sensor data comprises mud pulse datasets, mud system datasets, a mud report, periodic datasets of circulation pressure, density, mud rheology, or combinations thereof, wherein the wellbore path comprises a wellbore trajectory, a set of formation properties, a description of the wellbore environment comprising measurement of a hydrostatic pressure and a wellbore temperature by depth measurements, wherein the materials inventory comprises an inventory of wellbore tubulars, an inventory of cement ingredients, an inventory of chemicals, an inventory of downhole tools, or combinations thereof.

A sixth embodiment, which is the method of any of the first through the fifth embodiments, wherein the pumping model group comprises a least one model selected from a group consisting of a drilling fluid model, an isolation barrier model, a treatment blend model, a wellbore hydraulics model, a fluid displacement efficiency model, and a bond log prediction model; and wherein the design model group comprises at least one model selected from a group consisting of a drilling fluid model, an isolation barrier model, a treatment blend model, a wellbore hydraulics model, a fluid displacement efficiency model, and a bond log prediction model.

A seventh embodiment, which is the method of the first embodiment, wherein the first processor is located on a first computer at a wellsite, wherein the second processor is located on the first computer or located on a second computer at the wellsite, and wherein the first processor and second processor is within a computer system, a unit controller, a server, a workstation, a desktop computer, a laptop computer, a tablet computer, a smart phone, or combinations thereof.

A eighth embodiment, which is the method of any of the first through the seventh embodiments, wherein the first processor is on a computer located at a wellsite, wherein the second processor is on a computer located remote from the wellsite, and wherein the computer remote from the wellsite is a computer system, a virtual network function (VNF), a virtual server within a cloud computing environment, a server, a workstation, a desktop computer, a laptop computer, a tablet computer, a smart phone or combinations thereof.

A ninth embodiment, which is the method of the third embodiment, wherein the third processor is located on a first computer at a wellsite, and wherein the fourth processor is located on the first computer or located on a second computer at the wellsite.

A tenth embodiment, which is the method of the third embodiment, wherein the third processor is located on a computer remote from a wellsite, and wherein the fourth processor is located on the same computer as the third processor or located on a second computer remote from the wellsite.

An eleventh embodiment, which is the method of the first embodiment, wherein the storage computer is a data server, computer, virtual computer, VNF, or data storage device located at a wellsite or remote from the wellsite; and the electronic communication is wired communication, wireless communication selected from one of a cellular node, satellite communication, or short range radio frequency, or a combination thereof.

A twelfth embodiment, which is the method of the first embodiment, further comprising; transporting a job design and a pumping unit to a wellsite; assembling the pumping unit at the wellsite, wherein the pumping units are fluidically connected to a wellhead connector, wherein the wellhead connector is releasably connected to a wellbore of a treatment well; mixing the wellbore treatment per the pumping procedure; and operating the pump unit of the pumping operation to deliver the wellbore treatment to the wellhead connector per the pumping procedure.

A thirteenth embodiment, which is a computer-implemented method of modifying a wellbore treatment operation, comprising: receiving, by an advisory process executing on a first computer at a wellsite, a periodic dataset indicative of a pumping operation to place a wellbore treatment into a treatment well per a pumping procedure; identifying, by the advisory process, a change in a wellbore environment in response to at least one measurement of the periodic dataset comparing below an operational threshold; generating, by a pumping model group executing on a second computer, a set of pumping simulation results and a probability of achieving a job objective from a set of pumping model group inputs in response to the change in the wellbore environment; generating, by the advisory process, a modification to the pumping procedure in response to the identification of the change in the wellbore environment; and alerting, by the advisory process, service personnel of a probability of achieving the job objective.

A fourteenth embodiment, which is the method of the thirteenth embodiment, wherein the set of pumping model group inputs comprise a portion of the periodic dataset.

A fifteenth embodiment, which is the method of the thirteenth embodiment, wherein the second computer is i) at the wellsite, ii) the first computer executing the advisory process, or iii) a remote computer communicatively connected to the first computer at the wellsite.

A sixteenth embodiment, which is a cementing system at a wellsite, comprising: a wellhead connector releasably coupled to a treatment well; a pump unit fluidically connected to the wellhead connector; an advisory process, executing on a first computer system at the wellsite, controlling a pumping operation to deliver a wellbore treatment to the wellhead connector per a pumping procedure; wherein the advisory process is configured to perform the following: comparing a periodic dataset indicative of the pumping operation to a set of design simulation results; determining a change in a wellbore environment in response to a measurement from the periodic dataset exceeding at least one of a set of threshold operational values; generating, by a pumping model group executing on a second computer system, a set of pumping simulation results, and wherein a set of pumping model inputs comprise a set of the periodic dataset; modifying the pumping procedure in response to the set of pumping simulation results; alerting service personnel of a probability of achieving at least one job objective.

A seventeenth embodiment, which is the method of the sixteenth embodiment, further comprising: generating, by the pumping model group, a probability of achieving the job objective.

An eighteenth embodiment, which is the method of the sixteenth embodiment, wherein the set of design simulation results comprise the set of threshold operational values.

A nineteenth embodiment, which is the method of the sixteenth embodiment, wherein the second computer system is i) at the wellsite, ii) the same as the first computer system, or iii) a computer system remote from the wellsite.

A twentieth embodiment, which the method of the sixteenth embodiment, wherein the first computer system and the second computer system is communicatively connected via electronic communication.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A computer-implemented method of controlling a pumping operation of a wellbore treatment, comprising:

retrieving, by an advisory process executing on a first processor, a pumping procedure and a job objective for a wellbore treatment operation from a database, wherein the database is on a storage computer;

retrieving, by the advisory process, a set of design simulation results from the database or from a design model group;

retrieving, by the advisory process, a periodic dataset indicative of the pumping operation;

generating, by a pumping model group executing on a second processor, a set of pumping simulation results and a probability value of achieving the job objective in response to a set of pumping model inputs;

identifying, by the advisory process, a change in a wellbore environment from the set of pumping simulation results, wherein the advisory process is communicatively connected to the pumping model group via electronic communication, wherein the change in the wellbore environment comprises a cave-in, wherein the cave-in is a partial collapse of an inner wall of a wellbore onto a casing determined from a deviation of tubing pressure and annular pressure from the set of design simulation results;

modifying, by the advisory process, the pumping procedure in response to the identification of the change in the wellbore environment, wherein modifying the pumping procedure comprises changing a fluid blend of a cement slurry by adding a friction reducer to the cement slurry in response to the cave-in;

alerting, by the advisory process, service personnel of the probability value of achieving the job objective; and pumping the cement slurry down the wellbore in accordance with the modified pumping procedure.

2. The method of claim 1, further comprising:

comparing, by the advisory process, the periodic dataset to a set of operational threshold values; wherein the set of operational threshold values comprises the set of design simulation results, wherein the deviation is determined, by the advisory process, in response to a measurement from the periodic dataset exceeding at least one of the set of operational threshold values;

identifying, by the advisory process, the change in the wellbore environment in response to the deviation; and generating, by the advisory process, the set of pumping model inputs from the periodic dataset.

3. The method of claim 1, further comprising:

generating, by a design process executing on a third processor, a set of design model inputs from a wellbore dataset;

retrieving, by the design model group executing on a fourth processor, the set of design model inputs;

generating, by the design model group, the set of design simulation results and a probability value of achieving the design simulation results; and generating, by the design process, a job design in response to the set of design simulation results exceeding a threshold value.

4. The method of claim 3, wherein:

the wellbore dataset comprises a set of customer inputs, a set of sensor data, a wellbore path, and a materials inventory; and wherein the job design comprises a wellbore treatment, a cement blend, an inventory of wellbore treatment materials, an inventory of assigned pump, an inventory of downhole tools, an inventory of chemicals, or combinations thereof.

5. The method of claim 4, wherein:

the set of sensor data comprises mud pulse datasets, mud system datasets, a mud report, periodic datasets of circulation pressure, density, mud rheology, or combinations thereof, wherein the wellbore path comprises a wellbore trajectory, a set of formation properties, a description of the wellbore environment comprising measurement of a hydrostatic pressure and a wellbore temperature by depth measurements, wherein the materials inventory comprises an inventory of wellbore tubulars, an inventory of cement ingredients, an inventory of chemicals, an inventory of downhole tools, or combinations thereof.

6. The method of claim 3:

wherein the third processor is located on a first computer at a wellsite, and wherein the fourth processor is located on the first computer or located on a second computer at the wellsite.

7. The method of claim 3:

wherein the third processor is located on a first computer remote from a wellsite, and wherein the fourth processor is located on the first computer or located on a second computer remote from the wellsite.

8. The method of claim 1:

wherein the pumping model group comprises at least one model selected from a group consisting of a drilling fluid model, an isolation barrier model, a treatment blend model, a wellbore hydraulics model, a fluid displacement efficiency model, and a bond log prediction model; and wherein the design model group comprises at least one model selected from the group.

9. The method of claim 1:
wherein the first processor is located on a first computer at a wellsite,
wherein the second processor is located on the first computer or located on a second computer at the wellsite, and
wherein the first processor and second processor are within a computer system, a controller, a server, a workstation, a desktop computer, a laptop computer, a tablet computer, a smart phone, or combinations thereof.

10. The method of claim 1:
wherein the first processor is on a first computer located at a wellsite,
wherein the second processor is on a second computer located remote from the wellsite, and
wherein the second computer is a computer system, a virtual network function (VNF), a virtual server within a cloud computing environment, a server, a workstation, a desktop computer, a laptop computer, a tablet computer, a smart phone or combinations thereof.

11. The method of claim 1, wherein:
the storage computer is a data server, computer, virtual computer, a virtual network function (VNF), or data storage device located at a wellsite or remote from the wellsite; and
the electronic communication is wired communication, wireless communication selected from one of a cellular node, satellite communication, or short range radio frequency, or a combination thereof.

12. The method of claim 1, further comprising:
transporting a job design and a pump to a wellsite;
assembling the pump at the wellsite, wherein the pump is fluidically connected to a wellhead connector, wherein the wellhead connector is releasably connected to the wellbore;
mixing a wellbore treatment per the pumping procedure; and
operating the pump to deliver the wellbore treatment to the wellhead connector per the pumping procedure.

13. The method of claim 1, wherein the advisory process continually updates the set of pumping simulation results and the probability value as the pumping operation progresses.

14. A computer-implemented method of modifying a wellbore treatment operation, comprising:
receiving, by an advisory process executing on a first computer at a wellsite, a periodic dataset indicative of a pumping operation to place a wellbore treatment into a treatment well per a pumping procedure, wherein the wellbore treatment comprises a cement slurry;
retrieving, by the advisory process, a set of design simulation results;
identifying, by the advisory process, a change in a wellbore environment, wherein the change in the wellbore environment comprises a cave-in, wherein the cave-in is a partial collapse of an inner wall of a wellbore onto a casing determined from a deviation of tubing pressure and annular pressure from the set of design simulation results;
generating, by a pumping model group executing on a second computer, a set of pumping simulation results and a probability value of achieving a job objective from a set of pumping model group inputs in response to the change in the wellbore environment;
modifying, by the advisory process, the pumping procedure in response to identifying the cave-in, wherein modifying the pumping procedure comprises changing a fluid blend of the cement slurry by adding a friction reducer to the cement slurry in response to the cave-in;
alerting, by the advisory process, service personnel of the probability value of achieving the job objective; and
pumping the cement slurry down the wellbore in accordance with the modified pumping procedure.

15. The method of claim 14, wherein the set of pumping model group inputs comprise a portion of the periodic dataset.

16. The method of claim 14, wherein the second computer is at the wellsite, or a remote computer communicatively connected to the first computer.

17. A cementing system at a wellsite, comprising:
a wellhead connector releasably coupled to a treatment well;
a pump fluidically connected to the wellhead connector; and
an advisory process, executing on a first computer system at the wellsite, controlling the pump to deliver a wellbore treatment to the wellhead connector per a pumping procedure, wherein the wellbore treatment comprises a cement slurry;
wherein the advisory process is configured to perform the following:
comparing a periodic dataset indicative of a pumping operation to a set of design simulation results;
identifying a cave-in in a wellbore environment, wherein the cave-in is a partial collapse of an inner wall of a wellbore onto a casing determined by a deviation of tubing pressure and annular pressure from the set of design simulation results;
generating, by a pumping model group executing on a second computer system, a set of pumping simulation results and a probability value, wherein a set of pumping model inputs comprises a portion of the periodic dataset;
modifying the pumping procedure based on the set of pumping simulation results and in response to the cave-in, wherein modifying the pumping procedure comprises changing a fluid blend of the cement slurry by adding a friction reducer to the cement slurry in response to the cave-in;
alerting service personnel of the probability value of achieving at least one job objective; and
controlling the pump to deliver the cement slurry to the wellhead connector per the modified pumping procedure.

18. The cementing system of claim 17, wherein the set of design simulation results comprise a set of threshold operational values.

19. The cementing system of claim 17, wherein the second computer system is i) at the wellsite, ii) the same as the first computer system, or iii) a computer system remote from the wellsite.

20. The cementing system of claim 17, wherein the first computer system and the second computer system are communicatively connected via electronic communication.

* * * * *